(12) United States Patent
Lee et al.

(10) Patent No.: US 12,382,814 B2
(45) Date of Patent: Aug. 5, 2025

(54) DISPLAY DEVICE INCLUDING TRANSMISSION REGIONS AND ELECTRONIC DEVICE INCLUDING THE SAME

(71) Applicant: SAMSUNG DISPLAY CO., LTD., Yongin-si (KR)

(72) Inventors: Hyeonbum Lee, Hwaseong-si (KR); Chiwook An, Hwaseong-si (KR); Seong Min Wang, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 544 days.

(21) Appl. No.: 17/662,504

(22) Filed: May 9, 2022

(65) Prior Publication Data

US 2023/0050385 A1 Feb. 16, 2023

(30) Foreign Application Priority Data

Aug. 10, 2021 (KR) .......................... 10-2021-0105431

(51) Int. Cl.
*H10K 59/40* (2023.01)
*G06F 3/041* (2006.01)
*H10K 50/86* (2023.01)
*H10K 59/122* (2023.01)
*H10K 59/38* (2023.01)

(52) U.S. Cl.
CPC ........... *H10K 59/40* (2023.02); *G06F 3/0412* (2013.01); *H10K 50/865* (2023.02); *H10K 59/122* (2023.02); *H10K 59/38* (2023.02)

(58) Field of Classification Search
CPC .... H10K 59/40; H10K 50/865; H10K 59/122; H10K 59/38; H10K 59/8792; H10K 59/8791; H10K 59/875; H10K 59/65; H10K 50/86; H10K 59/60; G06F 3/0412; G06F 2203/04112; G06F 3/0446; G06F 3/0421
See application file for complete search history.

(56) References Cited

U.S. PATENT DOCUMENTS

| 9,761,851 | B2 | 9/2017 | Chang et al. |
| 10,719,172 | B2 | 7/2020 | Han et al. |
| 10,922,516 | B2 | 2/2021 | Kim et al. |
| 2019/0262470 | A1 | 8/2019 | Lee |

(Continued)

FOREIGN PATENT DOCUMENTS

| CN | 111599846 | 8/2020 |
| CN | 111668388 | 9/2020 |

(Continued)

*Primary Examiner* — Britt D Hanley
*Assistant Examiner* — William C. Trice, III
(74) *Attorney, Agent, or Firm* — F. CHAU & ASSOCIATES, LLC

(57) ABSTRACT

A display device includes a display panel on which a first light emitting element and a second light emitting element adjacent to the first light emitting element are disposed. A sensor layer including a touch electrode is disposed on the display panel. The touch electrode includes a first portion having a first width, a second portion having a second width that is smaller than the first width, and a third portion connecting the first portion to the second portion. The first portion, the second portion, and the third portion are each disposed between the first light emitting element and the second light emitting element.

20 Claims, 12 Drawing Sheets

(56) References Cited

U.S. PATENT DOCUMENTS

| | | | | |
|---|---|---|---|---|
| 2020/0075683 | A1* | 3/2020 | Polyakov | .............. G06F 3/0416 |
| 2021/0376003 | A1 | 12/2021 | Xu et al. | |
| 2022/0067340 | A1* | 3/2022 | Han | .................. G06V 40/1365 |

FOREIGN PATENT DOCUMENTS

| | | |
|---|---|---|
| KR | 1020160117728 | 10/2016 |
| KR | 1020190095630 | 8/2019 |
| KR | 1020200001298 | 1/2020 |
| KR | 1020200015869 | 2/2020 |

* cited by examiner

DISPLAY DEVICE INCLUDING TRANSMISSION REGIONS AND ELECTRONIC DEVICE INCLUDING THE SAME

CROSS-REFERENCE TO RELATED APPLICATIONS

This U.S. non-provisional patent application claims priority under 35 U.S.C. § 119 of Korean Patent Application No. 10-2021-0105431, filed on Aug. 10, 2021, the entire contents of which are hereby incorporated by reference.

TECHNICAL FIELD

The present disclosure herein relates to a display device and, more particularly, to a display device including transmission regions and an electronic device including the display device.

DISCUSSION OF THE RELATED ART

Electronic devices may include multiple electronic components such as display panels and electronic modules. The electronic modules may include cameras, infrared sensors, proximity sensors, and the like. The electronic modules may be placed below the display panels (i.e., behind the display panel). The display panels may include a region having higher transmittance than another region thereof. The electronic modules may receive or output optical signals through the region having high transmittance.

SUMMARY

A display device includes a display panel on which a first light emitting element and a second light emitting element adjacent to the first light emitting element are disposed. A sensor layer includes a touch electrode disposed on the display panel. The touch electrode includes a first portion having a first width, a second portion having a second width that is smaller than the first width, and a third portion connecting the first portion with the second portion. The first portion, the second portion, and the third portion are disposed between the first light emitting element and the second light emitting element.

The third portion may have a width gradually decreasing from the first width to the second width in a direction to the second portion from the first portion.

A direction in which the first portion extends may be different from a direction in which the second portion extends.

The display device may further include an anti-reflection layer disposed on the sensor layer. The anti-reflection layer may include color filters including a first color filter that covers the first light emitting element and a second color filter that covers the second light emitting element. A light blocking layer includes a light blocking material.

Light blocking layer openings including a first light blocking layer opening that at least partially overlaps the first light emitting element and a second light blocking layer opening that at least partially overlaps the second light emitting element may be defined in the light blocking layer.

The display panel may include a first pixel region at least partially overlapping the first light blocking layer opening and the first color filter, a second pixel region at least partially overlapping the second light blocking layer opening and the second color filter, a light blocking layer opening region at least partially overlapping the first light blocking layer opening and not overlapping the color filters, and a peripheral region at least partially surrounding each of the first pixel region, the second pixel region, and the light blocking layer opening region.

The touch electrode may at least partially overlap the peripheral region.

Touch openings may be defined in the touch electrode. Any one of the touch openings may at least partially overlap each of the first pixel region and the light blocking layer opening region. The other one of the touch openings may at least partially overlap the second pixel region. The touch electrode may at least partially overlap the peripheral region.

The display panel may further include a pixel definition layer in which first pixel openings and second pixel openings are defined. The first light emitting element and the second light emitting element may at least partially overlap any one of the first pixel openings. The second pixel openings might not overlap either the first light emitting element or the second light emitting element.

The light blocking layer opening region may include a transmission region that at least partially overlaps any one of the second pixel openings.

The light blocking layer opening region may further include a margin region at least partially overlapping the pixel definition layer.

The display panel may include a light emitting region corresponding to the first pixel opening, a pixel definition layer opening region corresponding to the second pixel opening, and a non-light emitting region at least partially surrounding the light emitting region and the pixel definition layer opening region.

The transmission region may overlap a portion of the pixel definition layer opening region.

A display device includes a display panel including a first pixel region having a first light emitting element disposed therein, a second pixel region adjacent to the first pixel region in a first direction and having a second light emitting element disposed therein, and a light blocking layer opening region having light transmitted therethrough and being adjacent to the first pixel region in a second direction crossing the first direction. A sensor layer includes a touch electrode disposed on the display panel and having a first touch opening exposing the first pixel region and the light blocking layer opening region and a second touch opening exposing the second pixel region defined therein. A width of a portion of the touch electrode adjacent to the light blocking layer opening region is smaller than a width of a portion of the touch electrode adjacent to the first pixel region and the second pixel region.

The display device may further include an anti-reflection layer including color filters and a light blocking layer and disposed on the sensor layer. Light blocking layer openings at least partially overlapping each of the first pixel region, the second pixel region, and light blocking layer openings may be defined in the light blocking layer. The display panel may further include a margin region at least partially overlapping the light blocking layer.

The color filters may overlap at least a portion of the peripheral region, the first pixel region, and the second pixel region, and might not overlap the light blocking layer opening region.

The display panel may further include a pixel definition layer, and in the pixel definition layer, first pixel openings each exposing the first light emitting element and the second light emitting element, and second pixel openings spaced apart from the first pixel openings may be defined.

The display panel may include a light emitting region at least partially overlapping the first pixel openings, a non-light emitting region at least partially overlapping the pixel definition layer, and a pixel definition layer opening region at least partially overlapping the second pixel openings. The light blocking layer opening region may include a transmission region at least partially overlapping the pixel definition layer opening region, and a margin region at least partially overlapping the non-light emitting region.

An electronic device includes a display device including a first active region including a light blocking layer opening region, a pixel region, and a peripheral region and having optical signals transmitted therethrough, and a second active region having the pixel region and the peripheral region, and adjacent to the first active region. An electronic module at least partially overlaps the first active region and is disposed below the display device. The display device includes a display panel in which a first light emitting element and a second light emitting element adjacent to the first light emitting element are disposed. A sensor layer includes a touch electrode disposed on the display panel. The touch electrode includes a first portion having a first width, a second portion having a second width that is smaller than the first width, and a third portion connecting the first portion with the second portion. The first portion, the second portion, and the third portion are disposed between the first light emitting element and the second light emitting element. The first light emitting element and the second light emitting element at least partially overlap the pixel region of the first active region. The first portion, the second portion, and the third portion at least partially overlap the peripheral region of the first active region.

The electronic module may be an illuminance sensor.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings.

DETAILED DESCRIPTION

Figure 1:
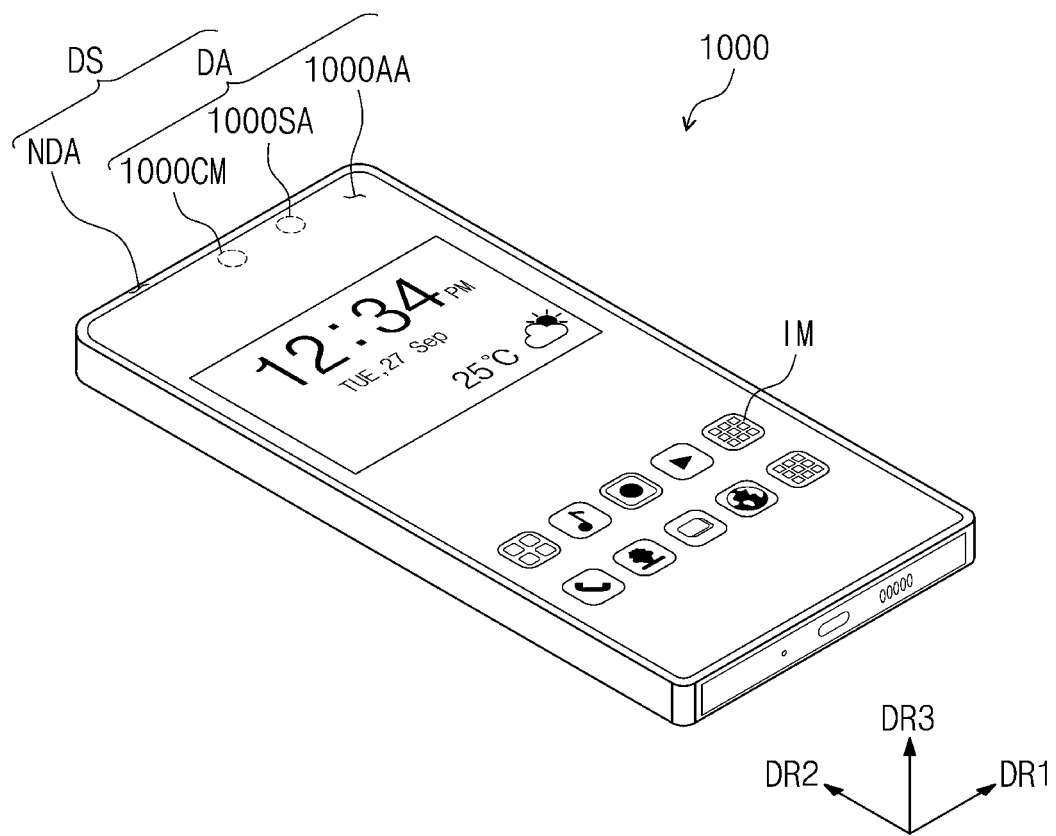
FIG. 1 is a perspective view of an electronic device according to an embodiment of the inventive concept.

In the present description, when an element (or a region, a layer, a portion, etc.) is referred to as being "on," "connected to," or "coupled to" another element, it may mean that the element may be directly disposed on/connected to/coupled to the other element, or that a third element may be disposed therebetween.

Like reference numerals may refer to like elements throughout the specification and the drawings. Also, in the drawings, the thickness, the ratio, and the dimension of elements may be exaggerated for effective description of the technical contents. However, it is to be understood that the thicknesses of the various depicted structures, the relative proportions, the angles shown, etc. may be indicative of at least one embodiment of the present disclosure. The term "and/or," may include all combinations of one or more of which associated configurations may define.

It will be understood that, although the terms first, second, etc. may be used herein to describe various elements, these elements should not necessarily be limited by these terms. These terms may be used to distinguish one element from another element. For example, a first element may be referred to as a second element, and similarly, a second element may be referred to as a first element without departing from the teachings of the present disclosure. The singular forms are intended to include the plural forms as well, unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, embodiments of the inventive concept will be described with reference to the accompanying drawings.

FIG. 1 is a perspective view of an electronic device 1000 according to an embodiment of the inventive concept.

Referring to FIG. 1, the electronic device 1000 may include a display device, and in this embodiment, a mobile phone is illustrated as an example. However, the embodiment of the inventive concept is not necessarily limited thereto, and the electronic device 1000 may be a tablet computer, a computer monitor, a TV set, a car navigation system, a game console, or a wearable device.

The electronic device 1000 may display images through a display region DA. The display region DA may include a plane defined by a first direction DR1 and a second direction DR2. However, the shape of the display region DA is not necessarily limited thereto. For example, the display region DA may be substantially flat, as illustrated, or the display region DA may further include curved surfaces each bent from at least two sides of the plane.

The electronic device 1000 may display an image IM through a display surface DS (or a front surface). As illustrated in FIG. 1, the display surface DS may include the display region DA in which the image IM is displayed, and a non-display region NDA positioned adjacent to the display region DA. The non-display region NDA is a region of the display surface DS on which images are not displayed. In FIG. 1, the non-display region NDA is illustrated in the form that at least partially surrounds the display region DA. However, the embodiment of the inventive concept is not necessarily limited thereto, and the non-display region NDA may be disposed on one side of the display region DA, or the non-display region NDA may be omitted.

The display region DA includes a first region 1000SA and a second region 1000AA positioned adjacent to the first region 1000SA.

The first region 1000SA is a portion of the display region DA that may have higher transmittance for an optical signal than the second region 1000AA. Accordingly, the electronic device 1000 may display images through the first region 1000SA and may also receive or transmit optical signals through the first region 1000SA.

In an embodiment, the electronic device 1000 may include a third region 1000CM. The third region 1000CM is a portion of the display region DA that may have higher transmittance for an optical signal than the second region 1000AA. Accordingly, the electronic device 1000 may display images through the third region 1000CM and may also receive or transmit optical signals through the third region 1000CM.

In FIG. 1, although a single first region 1000SA and a single third region 1000CM are illustrated as an example, the number of the first regions 1000SA and the third regions 1000CM is not necessarily limited thereto.

The electronic device 1000 may include an electronic module at least partially overlapping the first region 1000SA and the third region 1000CM. The electronic module may receive or output optical signals provided from the outside through the first region 1000SA and the third region 1000CM. For example, the electronic module may be a sensor module such as a proximity sensor that measures the distance between an object and a mobile phone, a camera module, a sensor for recognizing a part of a user's body (e.g., fingerprint, iris, or face), or a small lamp outputting light, but is not particularly limited thereto.

A thickness direction of the electronic device 1000 may be a third direction DR3 which is normal to the display surface DS. A front surface (or an upper surface) and a rear surface (or a lower surface) of members constituting the electronic device 1000 may be defined with respect to the third direction DR3.

Figure 2:
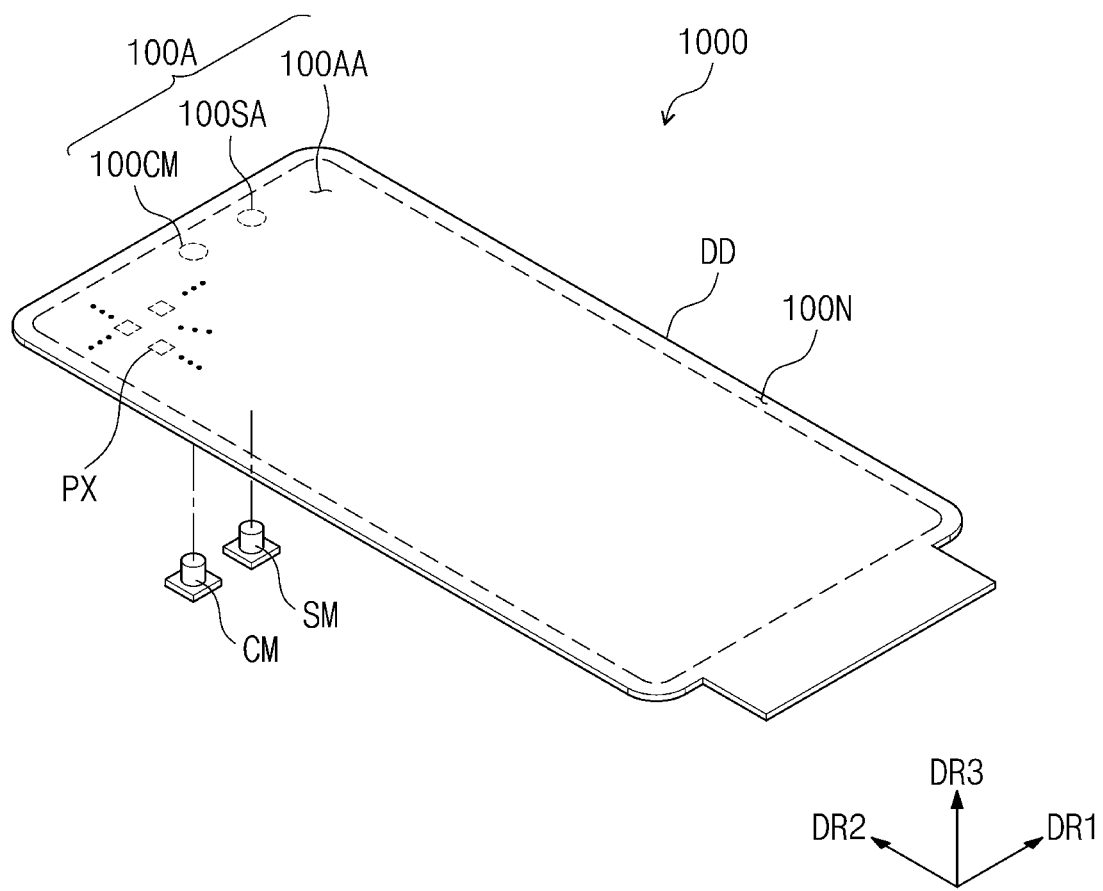
FIG. 2 is an exploded perspective view illustrating components of an electronic device according to an embodiment of the inventive concept.

FIG. 2 is an exploded perspective view illustrating components of the electronic device 1000 according to an embodiment of the inventive concept.

Referring to FIG. 2, the electronic device 1000 may include a display device DD, a sensor module SM, and a camera module CM. The display device DD may generate images and may detect external inputs. The sensor module SM and the camera module CM are disposed below (e.g., behind with respect to the third direction DR3) the display device DD. The sensor module SM and the camera module CM may be the electronic module described above.

The display device DD may include an active region 100A and a non-active region 100N. The active region 100A may correspond to the display region DA illustrated in FIG. 1, and the non-active region 100N may correspond to the non-display region NDA illustrated in FIG. 1.

The active region 100A may include a first active region 100SA, a second active region 100AA, and a third active region 100CM. The first active region 100SA, the second active region 100AA, and the third active region 100C may correspond to the first region 1000SA, the second region 1000AA, and the third region 1000CM illustrated in FIG. 1, respectively.

The first active region 100SA and the third active region 100CM may have higher light transmittance than the second active region 100AA. Accordingly, the first active region 100SA and the third active region 100CM may provide external natural light to the sensor module SM and the camera module CM, respectively. The first active region 100SA and the third active region 100CM are portions of the active region 100A, and thus may display images.

A pixel PX is disposed in the active region 100A. For example, light emitting elements may be disposed in the active region 100A and light emitting elements might not be disposed in the non-active region 100N. The pixel PX is respectively disposed in the first active region 100SA, the second active region 100AA, and the third active region 100CM.

Hereinafter, the first active region 100SA and the second active region 100AA will be mainly discussed.

Figure 3:
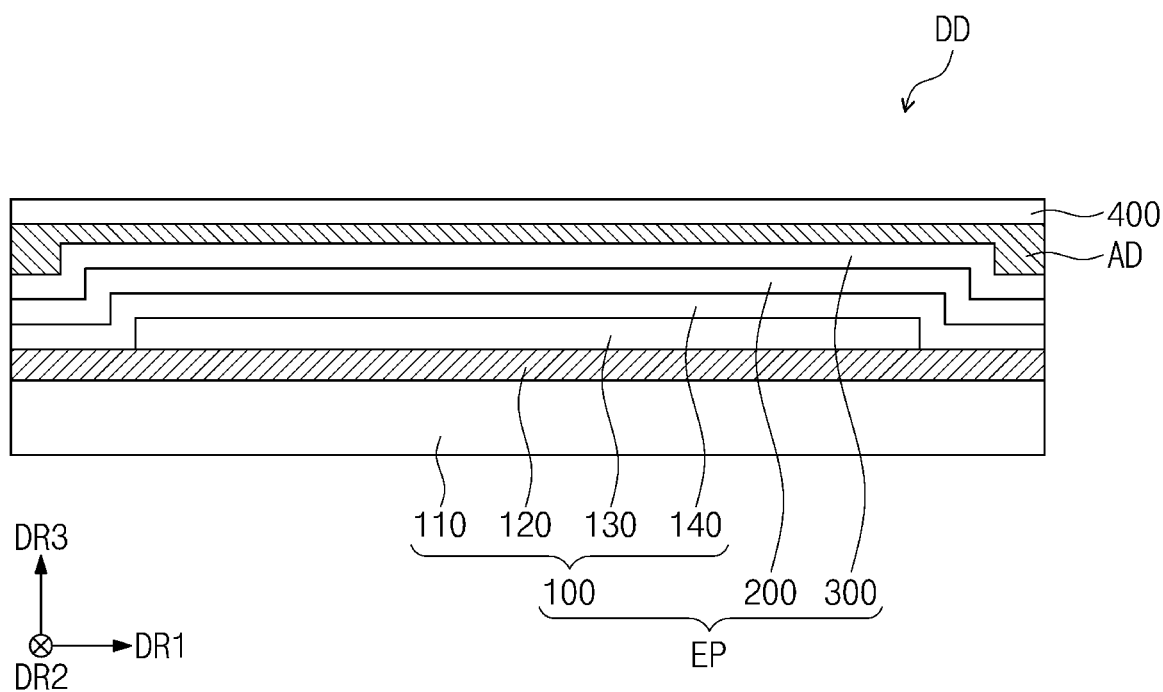
FIG. 3 is a cross-sectional view of a display device according to an embodiment of the inventive concept.

FIG. 3 is a cross-sectional view of a display device DD according to an embodiment of the inventive concept.

Referring to FIG. 3, the display device DD may include a display panel 100, a sensor layer 200, an anti-reflection layer 300, and a window 400. The anti-reflection layer 300 and the window 400 may be bonded to each other by an adhesive layer AD.

The display panel 100 may be a component for generating images. The display panel 100 may be a light emitting display panel, and for example, the display panel 100 may be an organic light emitting display panel, an inorganic light emitting display panel, a micro LED display panel, or a nano LED display panel. The display panel 100 may also be referred to as a display layer.

The display panel 100 may include a base layer 110, a circuit layer 120, a light emitting element layer 130, and an encapsulation layer 140.

The base layer 110 may be a member providing a base surface on which the circuit layer 120 is disposed. The base layer 110 may be a rigid substrate, or a flexible substrate that is bendable, foldable, rollable, or the like. The base layer 110 may be a glass substrate, a metal substrate, or a polymer substrate. However, the embodiment of the inventive concept is not necessarily limited thereto, and the base layer 110 may be an inorganic layer, an organic layer, or a composite material layer.

The base layer 110 may have a multi-layered structure. For example, the base layer 110 may include a first synthetic resin layer, a multi- or single-layered inorganic layer, and a second synthetic resin layer disposed on the multi or single-layered inorganic layer. The first and second synthetic resin layers each may include a polyimide-based resin, but are not particularly limited thereto.

The circuit layer 120 may be disposed on the base layer 110. The circuit layer 120 may include an insulating layer, a semiconductor pattern, a conductive pattern, and a signal line.

The light emitting element layer 130 may be disposed on the circuit layer 120. The light emitting element layer 130 may include a light emitting element. For example, the light emitting element may include organic light emitting materials, inorganic light emitting materials, organic-inorganic light emitting materials, quantum dots, quantum rods, micro LEDs, or nano LEDs.

The encapsulation layer 140 may be disposed on the light emitting element layer 130. The encapsulation layer TFE may serve to protect the light emitting element layer 130 from moisture, oxygen, and foreign substances such as dust particles. The encapsulation layer 140 may include at least one inorganic layer. The encapsulation layer 140 may include a stack structure of an inorganic layer/an organic layer/an inorganic layer.

The sensor layer 200 may be disposed on the display panel 100. The sensor layer 200 may detect external inputs applied from the outside. The external inputs may be a user's inputs. The user's inputs may include various types of external inputs such as a touch from a part of a user's body, light, heat, a touch from a stylus/pen, or pressure applied by any implement.

The sensor layer 200 may be formed on the display panel 100 through a continuous process. In this case, the sensor layer 200 may be directly disposed on the display panel 100. "Being directly disposed" as described herein may indicate that no third component is disposed between the sensor layer 200 and the display panel 100. For example, a separate adhesive member might not be disposed between the sensor layer 200 and the display panel 100.

The anti-reflection layer 300 may be directly disposed on the sensor layer 200. The anti-reflection layer 300 may reduce reflectance of external light incident from the outside of the display device DD. The anti-reflection layer 300 may be formed on the sensor layer 200 through a continuous process. The anti-reflection layer 300 may include color filters. The color filters may have a predetermined arrangement. For example, the color filters may be arranged in consideration of light emitting colors of pixels included in the display panel 100. In addition, the anti-reflection layer 300 may further include a light blocking layer positioned adjacent to the color filters. The light blocking layer may have light absorption properties, and for example, the light blocking layer may be black in color.

Details of the structure of the anti-reflection layer 300 will be described later with respect to FIGS. 8 to 10 and 12.

In the present description, the electronic panel EP may be understood as a configuration including the display panel 100, the sensor layer 200, and the anti-reflection layer 300.

In an embodiment of the inventive concept, the sensor layer 200 may be omitted. In this case, the anti-reflection layer 300 may be directly disposed on the display panel 100. In an embodiment of the inventive concept, the positions of the sensor layer 200 and the anti-reflection layer 300 may be reversed.

In an embodiment of the inventive concept, the display device DD may further include an optical layer disposed on the anti-reflection layer 300. For example, the optical layer may be formed on the anti-reflection layer 300 through a continuous process. The optical layer may control the direction of the light incident from the display panel 100 to increase the front luminance of the display device DD. For example, the optical layer may include an organic insulating layer in which openings are defined to respectively correspond to light emitting regions of pixels included in the display panel 100, and a high refractive layer covering the organic insulating layer and filling the openings. The high refractive layer may have a higher refractive index than the organic insulating layer.

The window 400 may provide a front surface of the electronic device 1000. The window 400 may include a glass film or a synthetic resin film as a base film. The window 400 may further include an anti-reflection layer or an anti-fingerprint layer. The window 400 may include a glass film or a synthetic resin film. The window 400 may further include a bezel pattern at least partially overlapping the non-active region 100N of the display panel 100.

Figure 4:
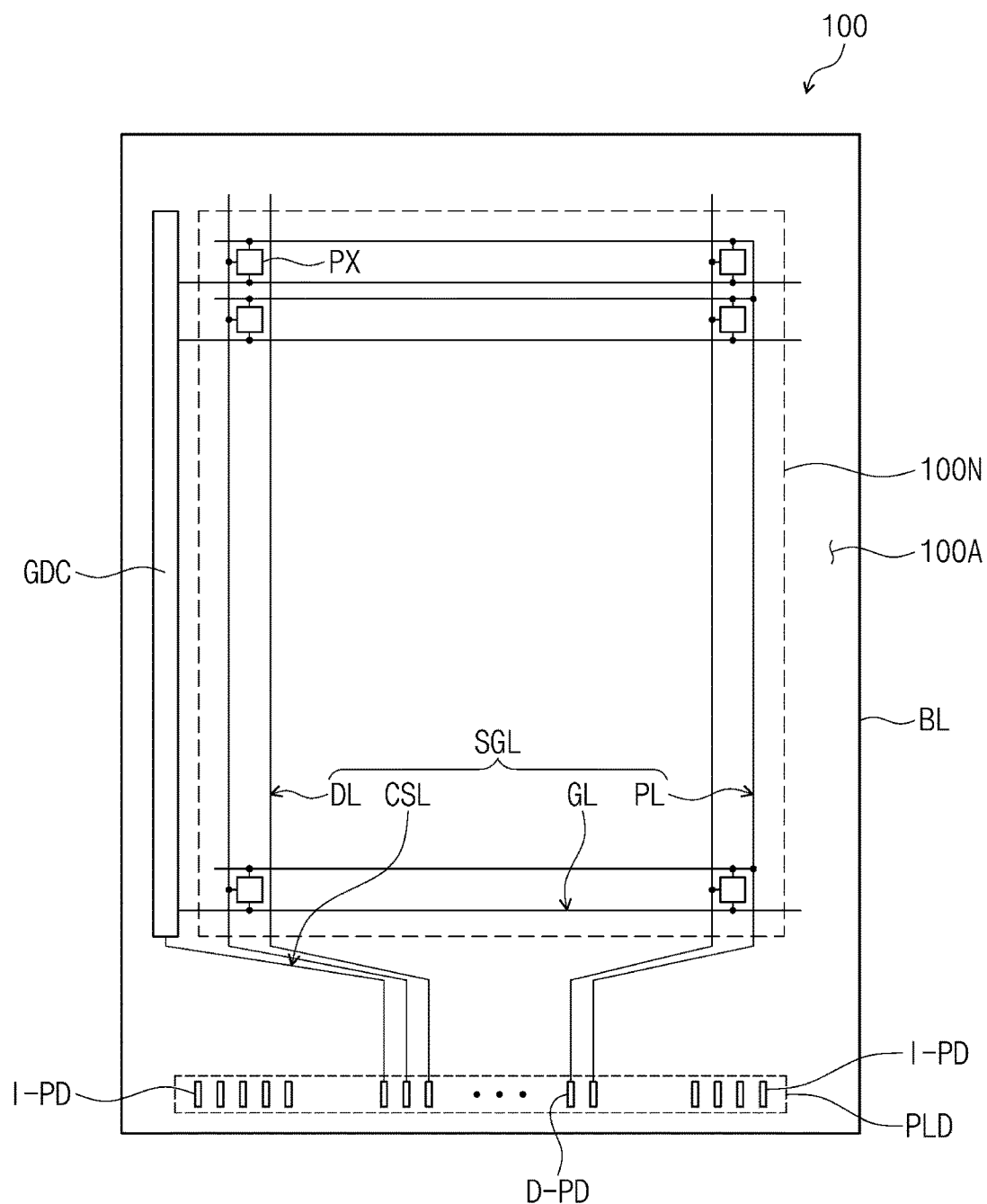
FIG. 4 is a plan view of a display panel according to an embodiment of the inventive concept.

FIG. 4 is a plan view of the display panel 100 according to an embodiment of the inventive concept.

Referring to FIG. 4, the display panel 100 may include a base layer BL divided into the active region 100A and the non-active region 100N, as described above. The display panel 100 may include pixels PX disposed in the active region 100A, and signal lines SGL electrically connected to the pixels PX. The display panel 100 may include a driving circuit GDC and a pad portion PLD disposed in the non-active region 100N.

The pixels PX each include a light emitting element and a pixel driving circuit connected thereto, which will be described later. The signal lines SGL may include gate lines GL, data lines DL, a power line PL, and a control signal line CSL. The gate lines GL each are connected to a corresponding pixel PX among the pixels PX, and the data lines DL each are connected to a corresponding pixel PX among the pixels PX. The power line PL may be connected to the pixels PX. The control signal line CSL may be connected to the driving circuit GDC to provide control signals to the driving circuit GDC.

The driving circuit GDC may include a gate driving circuit. The gate driving circuit may generate gate signals and sequentially output the gate signals to the gate lines GL which will described later. The gate driving circuit may further output another control signal to the pixel driving circuit.

The pad portion PLD may be a portion to which an external circuit board is connected. The pad portion PLD may include pixel pads D-PD and input pads I-PD. The pixel pads D-PD may be pads designed to connect the external circuit board to the display panel 100. The input pads I-PD may be pads designed to connect the external circuit board to the sensor layer 200.

The pixel pads D-PD each may be connected to a corresponding signal line among the signal lines SGL. The pixel pads D-PD may be connected to corresponding pixels PX through the signal lines SGL. In addition, the driving circuit GDC may be connected to any one of the pixel pads D-PD.

Figure 5:
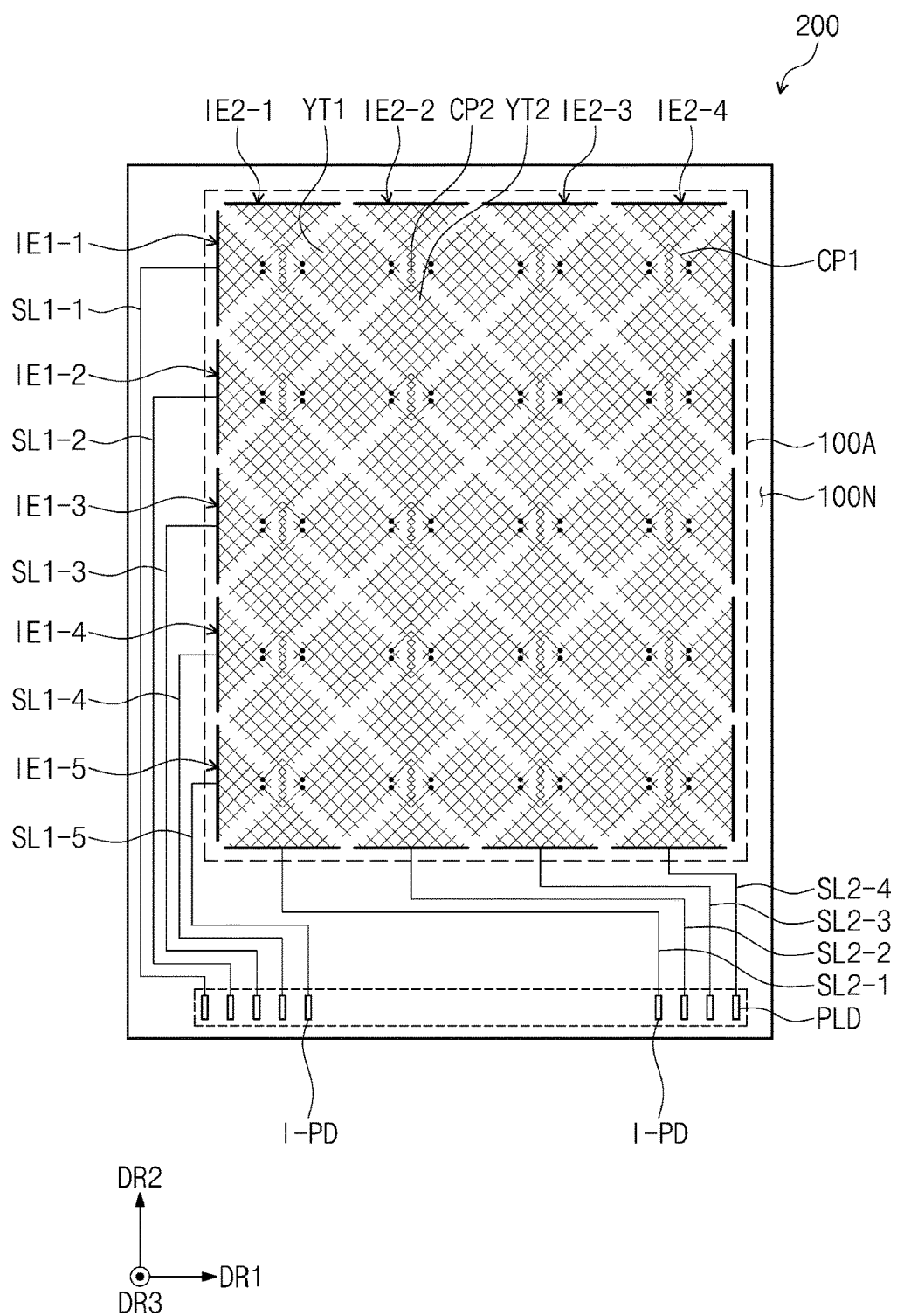
FIG. 5 is a plan view of a sensor layer according to an embodiment of the inventive concept.

FIG. 5 is a plan view of the sensor layer 200 according to an embodiment of the inventive concept.

Referring to FIG. 5, the sensor layer 200 according to an embodiment may include a plurality of sensing electrodes and a plurality of signal lines. The sensor layer 200 may include first sensing electrodes IE1-1 to IE1-5 and second sensing electrodes IE2-1 to IE2-4. The sensor layer 200 may include first signal lines SL1-1 to SL1-5 connected to the first sensing electrodes IE1-1 to IE1-5, and second signal lines SL2-1 to SL2-4 connected to the second sensing electrodes IE2-1 to IE2-4.

The first sensing electrodes IE1-1 to IE1-5 and the second sensing electrodes IE2-1 to IE2-4 may cross each other. The first sensing electrodes IE1-1 to IE1-5 may extend along the second direction DR2 and be arranged along the first direction DR1. The second sensing electrodes IE2-1 to IE2-4 may extend along the first direction DR1 and be arranged along the second direction DR2. The first sensing electrodes IE1-1 to IE1-5 and the second sensing electrodes IE2-1 to IE2-4 may be electrically insulated from each other.

The first signal lines SL1-1 to SL1-5 and the second signal lines SL2-1 to SL2-4 may be disposed in the non-active region 100N. The first signal lines SL1-1 to SL1-5 and the second signal lines SL2-1 to SL2-4 each may be connected to the input pads I-PD disposed in the non-active region 100N.

The first signal lines SL1-1 to SL1-5 each may be connected to one end of a corresponding first sensing electrode among the first sensing electrodes IE1 to IE1-5. Some of the first signal lines SL1-1 to SL1-5 may be connected to one end of the first sensing electrode, and the remaining ones may be connected to the other end of the first sensing electrode. However, the present invention is not necessarily limited to this particular arrangement.

The second signal lines SL2-1 to SL2-4 each may be connected to one end of a corresponding second sensing electrode among the second sensing electrodes IE2-1 to IE2-4. The sensor layer 200 may further include signal lines connected to the other ends of the second sensing electrodes IE2-1 to IE2-4. However, the present invention is not necessarily limited to this particular arrangement.

The first sensing electrodes IE1-1 to IE1-5 each may include first sensor portions YT1 and first connection portions CP1 disposed in the active region 100A. In one first sensing electrode, the first sensor portions YT1 may be arranged along the second direction DR2. The first connection portions CP1 each may connect the first sensor portions YT1 positioned adjacent to each other along the second direction DR2. Two of the first sensor portions disposed on both ends of the first electrode among the first sensor portions YT1 may have a smaller size, for example, ½ size, compared to the first sensor portions disposed at the center.

The second sensing electrodes IE2-1 to IE2-4 each may include second sensor portions YT2 and second connection portions CP2 disposed in the active region 100A. In one second sensing electrode, the second sensor portions YT2 may be arranged along the first direction DR1. The second connection portions CP2 each may connect the second sensor portions YT2 positioned adjacent to each other along the first direction DR1. Two of the second sensor portions disposed on both ends of the second electrode among the second sensor portions YT2 may have a smaller size, for example, ½ size, compared to the second sensor portions disposed at the center.

The first sensor portions YT1 of the first sensing electrodes IE1 to IE1-5, the second sensor portions YT2 of the second sensing electrodes IE2-1 to IE2-4, and the second connection portions CP2 may be formed on the same layer. In one first sensing electrode, the first sensor portions YT1 may be spaced apart from each other with the second sensing electrodes IE2-1 to IE2-4 therebetween. The first connection portion CP1 of the first sensing electrodes IE1-1 to IE1-5 may be formed on a different layer from the first sensor portions YT1, and thus be electrically connected to the first sensor portions YT1, and electrically interconnect the first sensor portions YT1.

The first sensing electrodes IE1-1 to IE1-5 and the second sensing electrodes IE2-1 to IE2-4 each have a mesh shape, and thus might not overlap the pixels PX disposed in the display panel 100.

The first sensing electrodes IE1-1 to IE1-5 and the second sensing electrodes IE2-1 to IE2-4 having the mesh shape might not be observable from the outside of the electronic device 1000.

In addition, the mesh-shaped first sensing electrodes IE1-1 to IE1-5 and second sensing electrodes IE2-1 to IE2-4 may reduce parasitic capacitance generated between adjacent electrodes.

The first sensing electrodes IE1-1 to IE1-5 and the second sensing electrodes IE2-1 to IE2-4 each may include silver, aluminum, copper, chromium, nickel, titanium, and other materials that are low-temperature-processable.

FIG. 5 illustrates the first sensing electrodes IE1-1 to IE1-5 and the second sensing electrodes IE2-1 to IE2-4 according to an embodiment as an example, but the shape thereof is not necessarily limited thereto. For example, the first sensing electrodes IE1-1 to IE1-5 and the second sensing electrodes IE2-1 to IE2-4 may be in the shape that the sensor portions YT1 and YT2 and the connection portions CP1 and CP2 are made with no separation (e.g., a bar shape). Alternatively, the shapes of the first sensor portions YT1 and the second sensor portions YT2 are not necessarily limited to the illustrated diamond shape, and may have other polygonal shapes.

Figure 6:
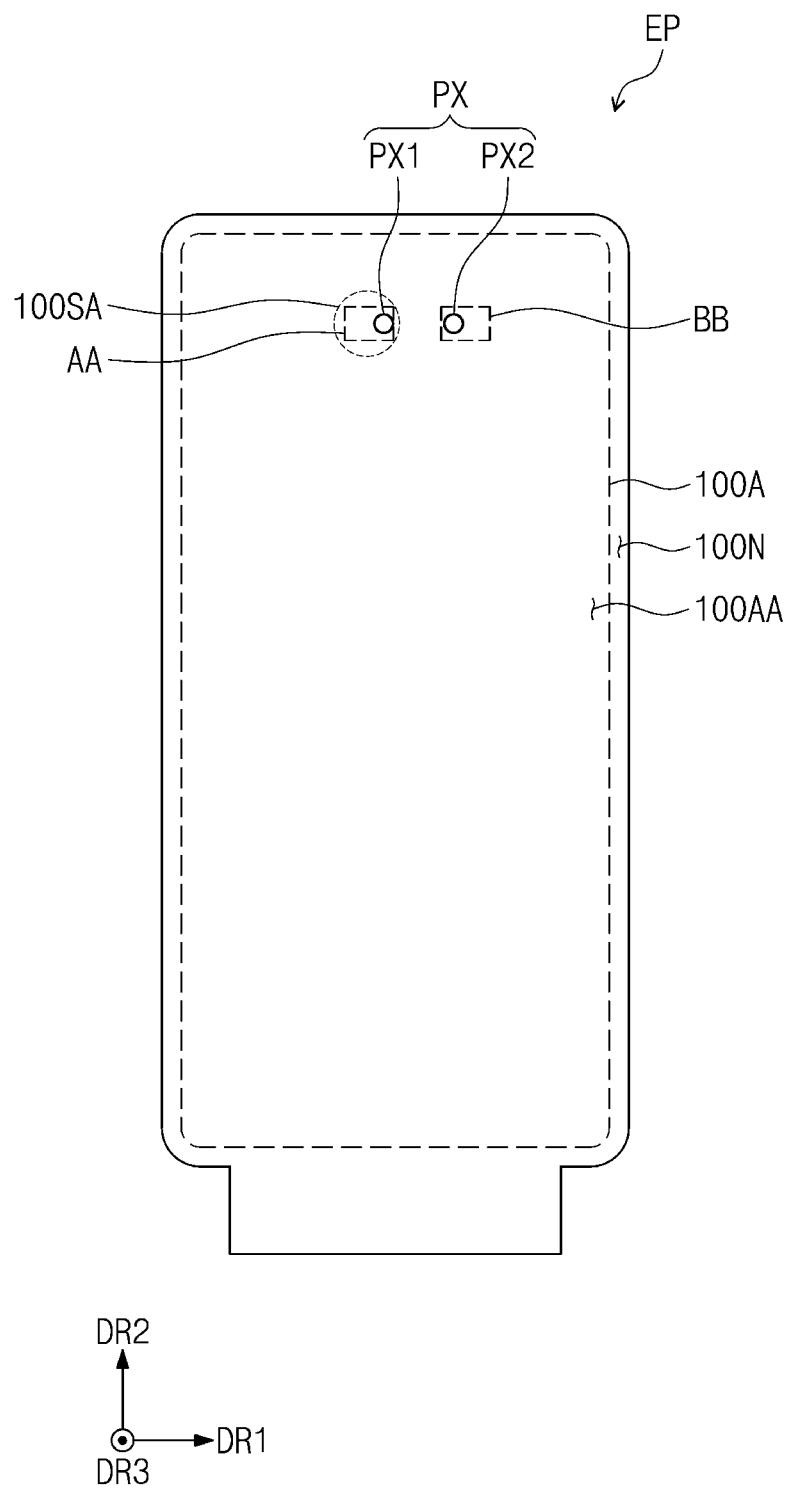
FIG. 6 is a plan view of an electronic panel according to an embodiment of the inventive concept.

FIG. 6 is a plan view of the electronic panel EP according to an embodiment of the inventive concept.

The electronic panel EP as described above may include the display panel 100, the sensor layer 200, and the anti-reflection layer 300. In the electronic panel EP, the active region 100A and the non-active region 100N described above may be defined.

Referring to FIG. 6, the pixels PX may be disposed in the active region 100A. In an embodiment, the pixels PX may include a first pixel PX1 disposed in the first active region 100SA and a second pixel PX2 disposed in the second active region 100AA.

Although the first active region 100SA is illustrated to have a circular shape in FIG. 6, the first active region 100SA may have various shapes such as a polygon, an ellipse, a shape having at least one curved side, or an irregular shape, and is not necessarily limited to any one embodiment.

The first pixel PX1 and the second pixel PX2 each may be provided in plural. In this case, the first pixels PX1 and the seconds pixel PX2 each may include red pixels, green pixels, and blue pixels, and may further include white pixels according to an embodiment.

The first active region 100SA and the second active region 100AA may be divided according to light transmittance. The light transmittance is measured within a reference area.

When classifying those regions based on the light transmittance, the first active region 100SA may be a region having higher light transmittance than the second active region 100AA. This is because the first active region 100SA has a lower ratio of an area occupied by a light blocking structure which will be described later than the second active region 100AA. The non-occupied area of the light blocking structure corresponds to a transmission region of optical signals. The light blocking structure may include a conductive pattern of a circuit layer, a pixel definition layer, a light blocking layer, and a first electrode of the light emitting element layer 130, and an emission layer which will be described later.

Figure 7:
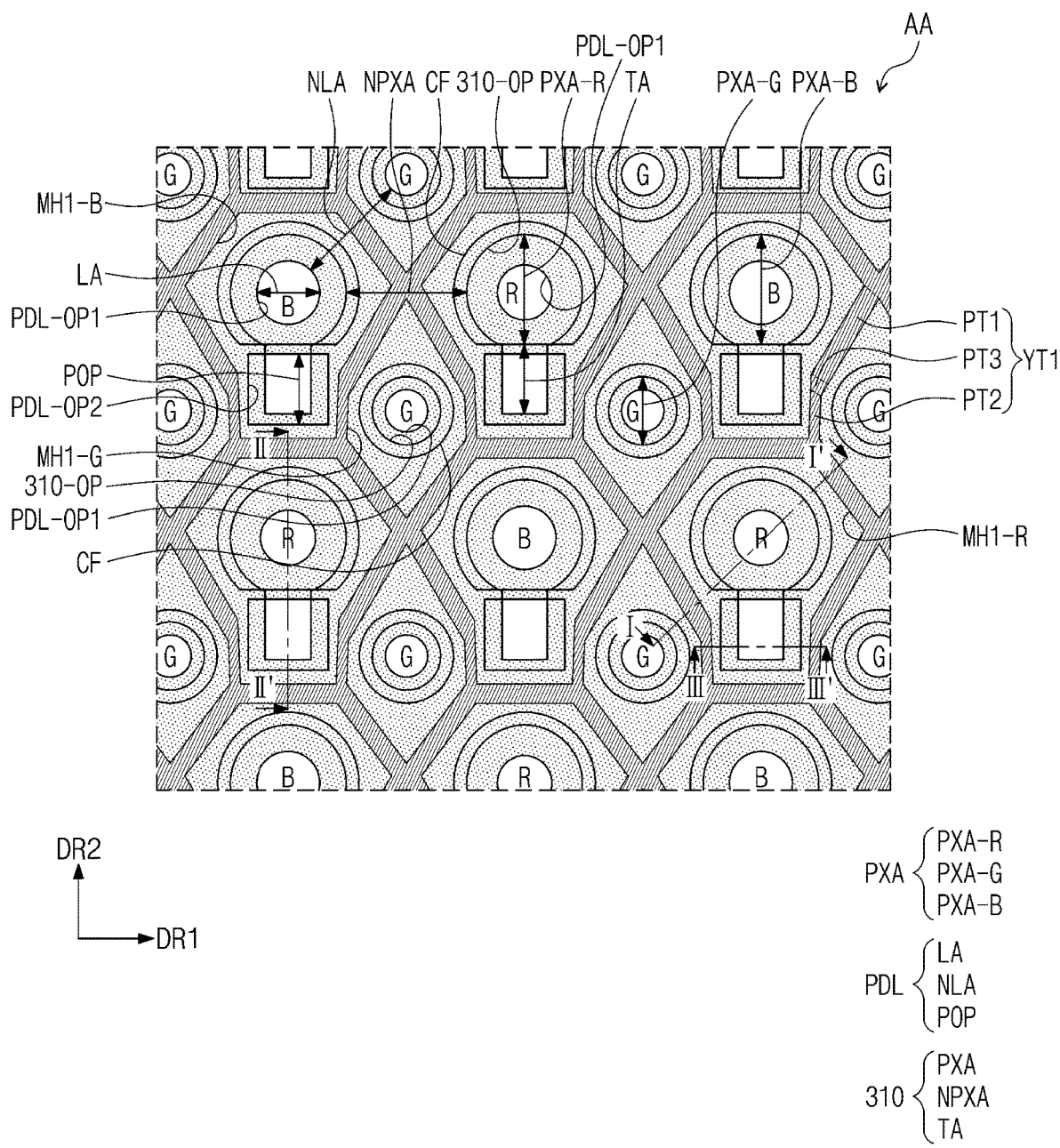
FIG. 7 is a plan view enlarging region AA of FIG. 6.

FIG. 7 is a plan view enlarging region AA of FIG. 6.

For example, FIG. 7 may be an enlarged portion of the first active region 100SA of the electronic panel EP in FIG. 6.

The display panel 100 (see FIG. 3) included in the electronic panel EP (see FIG. 6) may include a pixel definition layer PDL. A first pixel opening PDL-OP1 and a second pixel opening PDL-OP2, which are spaced apart from each other, may be defined in the pixel definition layer PDL. The first pixel opening PDL-OP1 and the second pixel opening PDL-OP2 each may be provided in plural. The first pixel openings PDL-OP1 may at least partially overlap light emitting elements, and the second pixel openings PDL-OP2 might not overlap light emitting elements.

In an embodiment, the pixel definition layer PDL may include a light emitting region LA corresponding to the first pixel opening PDL-OP1, a pixel definition layer opening region POP corresponding to the second pixel opening PDL-OP2, and a non-light emitting region NLA at least partially surrounding the light emitting region LA and the pixel definition layer opening region POP.

The light emitting region LA may be a region in which light is generated from a light emitting element. For example, red light R, green light G, or blue light B may be generated in the light emitting region LA. Light emitted from the light emitting region LA may be emitted to the outside of the display panel 100 through the first pixel opening PDL-OP1.

The pixel definition layer opening region POP may be a region at least partially overlapping electronic modules such as the sensor module SM described above in FIG. 2. The sensor module SM (FIG. 2) may receive external light through the second pixel opening PDL-OP2.

In the present description, the light emitting region, the pixel definition layer opening region, and the non-light emitting region of the display panel 100 (see FIG. 3) may correspond to the light emitting region LA, the pixel definition layer opening region POP, and the non-light emitting region NLA defined in the pixel definition layer PDL, respectively.

The anti-reflection layer 300 (see FIG. 3) included in the electronic panel EP (see FIG. 6) may include a light blocking layer 310 and a color filter CF. A light blocking layer opening 310-OP may be defined in the light blocking layer 310. The light blocking layer opening 310-OP and the color filter CF each may be provided in plural. At least a portion of the light blocking layer opening 310-OP may be covered by the color filter CF.

In an embodiment, the light blocking layer 310 may include a pixel region PXA at least partially overlapping the light blocking layer opening 310-OP and the color filter CF, a light blocking layer opening region TA at least partially overlapping the light blocking layer opening 310-OP and not overlapping the color filter CF, and a peripheral region NPXA at least partially surrounding the pixel region PXA and the light blocking layer opening region TA.

The pixel region PXA may be a region in which light generated from the light emitting element is emitted to the outside. The color filter CF may block some wavelength bands of light emitted from the pixel region PXA, thereby enhancing color purity of light generated from the light emitting element.

In an embodiment, a plurality of pixel regions PXA may be provided. For example, the pixel regions PXA may include a first pixel region PXA-R emitting red light R, a second pixel region PXA-G emitting green light G, and a third pixel region PXA-B emitting blue light B.

The light blocking layer opening region TA might not overlap the light blocking layer 310 or the color filter CF. Accordingly, light incident from the outside may pass through the display panel 100 (see FIG. 2) through the light blocking layer opening region TA without being absorbed by the light blocking layer 310 or the color filter CF. An electronic module such as the sensor module SM (see FIG. 2) may be disposed below the light blocking layer opening region TA to receive light incident from the outside. Details of the structure of the light blocking layer opening region TA will be described later with reference to FIG. 9.

The color filter CF may overlap at least the pixel region PXA. The color filter CF may further at least partially overlap the peripheral region NPXA. A portion of the color filter CF may be disposed on the light blocking layer 310. The color filter CF may block some wavelength bands of light emitted from the pixel region PXA. Accordingly, reflection of external light by a first electrode AE1 or a second electrode CE of the color filter CF may be reduced.

A plurality of color filters CF may be provided, and at least two of the plurality of color filters CF may have different colors.

In the present description, the pixel region, the transmission region, and the peripheral region of the display panel 100 (see FIG. 3) may correspond to the pixel region PXA, the light blocking layer opening region TA, and the peripheral region NPXA defined in the light blocking layer 310, respectively.

The electronic panel EP (see FIG. 6) includes the sensor layer 200 (see FIG. 3) disposed on the display panel 100 (see FIG. 3).

FIG. 7 illustrates first sensor portions YT1 included in the sensor layer 200 (see FIG. 3) as an example. Hereinafter, the first sensor portions YT1 will be described as a touch electrode YT1. However, the embodiment is not necessarily limited thereto, and the touch electrode YT1 may be the first connection portions CP1, the second sensor portions YT2, or the second connection portions CP2 described above in FIG. 3.

The touch electrode YT1 might not overlap the first to third pixel regions PXA-R, PXA-G, and PXA-B, and may at least partially overlap the peripheral region NPXA. For example, touch openings MH1-R, MH1-B, and MH1-G at least partially overlapping the pixel region PXA may be defined in the touch electrode YT1.

In an embodiment, a plurality of touch openings MH1-R, MH1-B, and MH1-G may be provided. For example, the touch openings MH1-R, MH1-B, and MH1-G may include a first touch opening MH1-R corresponding to the first pixel region PXA-R, a second touch opening MH1-G corresponding to the second pixel region PXA-G, and a third touch opening MH1-B corresponding to the third pixel region PXA-B. The first to third touch openings MH1-R, MH1-B, and MH1-G may cover the first to third pixel regions PXA-R, PXA-G, and PXA-B, respectively.

In an embodiment, the touch electrode YT1 includes the touch openings MH1-R, MH1-B, and MH1-G, and thus may have a mesh shape. However, the shape of the touch electrode YT1 is not necessarily limited thereto.

For example, the first touch openings MH1-R may at least partially overlap the first pixel region PXA-R and the light blocking layer opening region TA. The second touch openings MH1-G may at least partially overlap the second pixel region PXA-G. The third touch opening MH1-B may at least partially overlap the third pixel region PXA-B and the light blocking layer opening region TA.

The first pixel region PXA-R and the light blocking layer opening region TA may be separated from the second pixel region PXA-G by the first touch opening MH1-R and the second touch opening MH1-G. The third pixel region PXA-B and the light blocking layer opening region TA may be separated from the second pixel region PXA-G by the second touch opening MH1-G and the third touch opening MH1-B.

The touch electrode YT1, according to an embodiment of the inventive concept, may include a first portion PT1 having a first width, a second portion PT2 having a second width that is smaller than the first width, and a third portion PT3 connecting the first portion PT1 with the second portion PT2. The third portion PT3 may extend from the first portion PT1, and the second portion PT2 may extend from the third portion PT3. For example, the touch electrode YT1 may have a single body shape in the order of the first portion PT1, the third portion PT3, and the second portion PT2. In an embodiment, the first portion PT1, the second portion PT2, and the third portion PT3 may differ in the directions each one extends.

The width of the first portion PT1 may be a first width. For example, the first width may be about 3.5 µm to about 5.5 µm. For example, the first width may be about 4.5 µm. The width of the second portion PT2 may be a second width. For example, the second width may be about 1 µm to about 3 µm. For example, the second width may be about 2 µm. However, the first width and the second width are not necessarily limited thereto.

The third portion PT3 may have a first width at a portion adjacent to the first portion PT1 and a second width at a portion adjacent to the second portion PT2. The third portion PT3 may have a width gradually decreasing from the first width to the second width in a direction heading to the second portion PT2 from the first portion PT1.

In an embodiment, the first pixel region PXA-R and the light blocking layer opening region TA may be separated from the second pixel region PXA-G by the touch electrode YT1, and the touch electrode YT1 may include the first portion PT1, the third portion PT3, and the second portion PT2.

For example, the first pixel region PXA-R and the light blocking layer opening region TA may be disposed in a first pixel column, and the second pixel region PXA-G may be disposed in a second pixel column. The first portion PT1, the second portion PT2, and the third portion PT3 may be disposed between the first pixel column and the second pixel column.

For example, the first portion PT1 may be disposed between the first pixel region PXA-R and the second pixel region PXA-G, and the second portion PT2 may be disposed between the light blocking layer opening region TA and the second pixel region PXA-G. The third portion PT3 may connect the first portion PT1 with the second portion PT2.

The second portion PT2 has a smaller width than the first portion PT1 and the third portion PT3, and thus may secure a space next to the second portion PT2 for the light blocking layer opening portion TA. In particular, the second portion PT2 extends in a different direction from the first portion PT1 and the third portion PT3, and has a smaller width, and thus may form a space next to the second portion PT2 for the light blocking layer opening portion TA. Details of the structure of the light blocking layer opening region TA will be described later.

Figure 8:
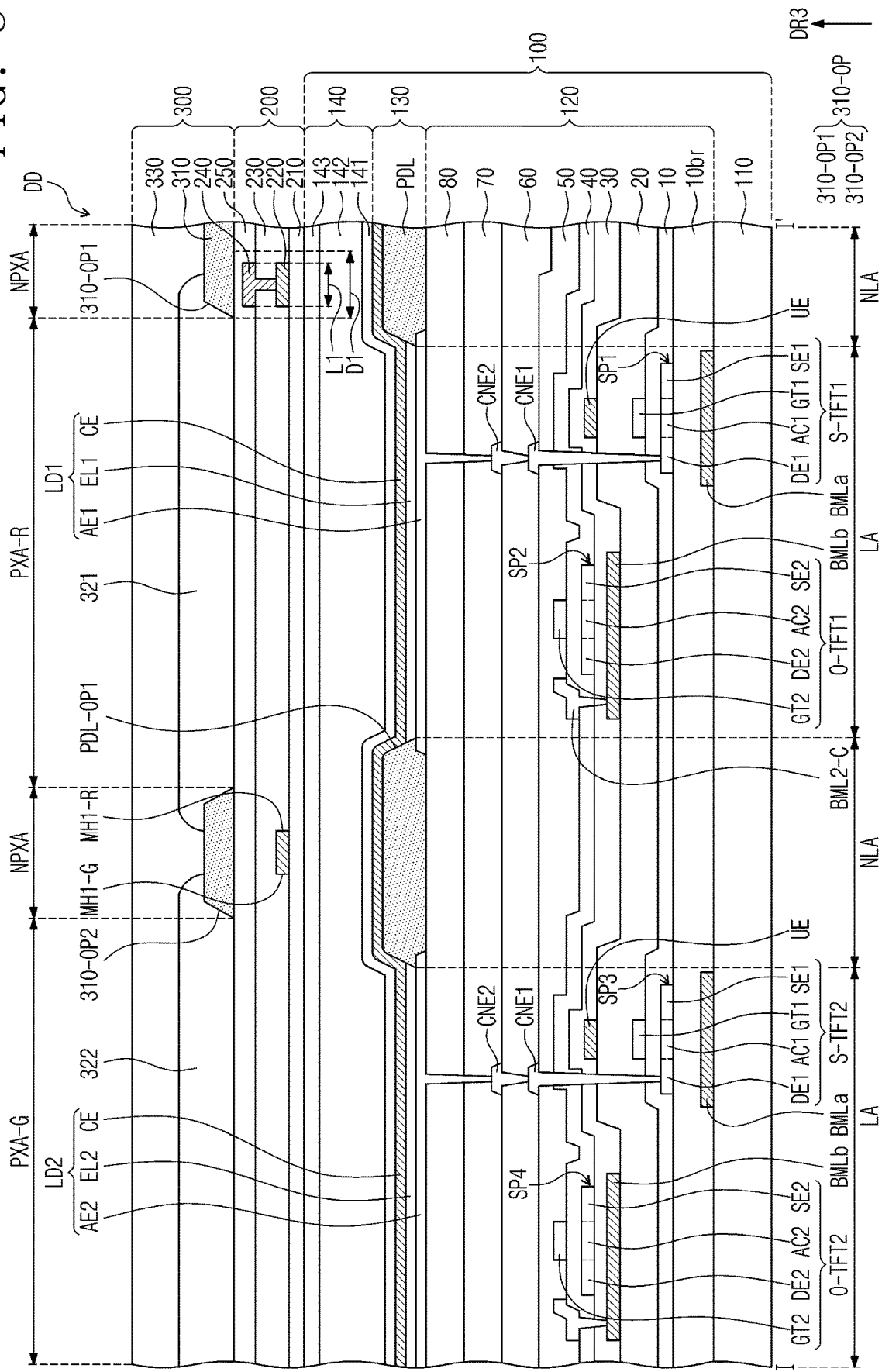
FIG. 8 is a cross-sectional view corresponding to I-I' of FIG. 7.

FIG. 8 is a cross-sectional view corresponding to I-I' of FIG. 7.

FIG. 8 is a cross-sectional view of a first pixel region PXA-R', a second pixel region PXA-G', and a peripheral region.

Referring to FIG. 8, a first light emitting element LD1 and a second light emitting element LD2 may be disposed in the first pixel region PXA-R and the second pixel region PXA-G, respectively. A third light emitting element LD3 may be disposed in the third pixel region PXA-B, and descriptions of the first light emitting element LD1 may be equally applied to the third light emitting element LD3 which will be described later.

A first silicon transistor S-TFT1 and a first oxide transistor O-TFT1 may be disposed in the first pixel region PXA1-R. The first silicon transistor S-TFT1 may be connected to the first light emitting element LD1. The first silicon transistor S-TFT1 and the first oxide transistor O-TFT1 might only be partially illustrated among a plurality of transistors connected to the first light emitting element LD1.

A second silicon transistor S-TFT2 and a second oxide transistor O-TFT2 may be disposed in the second pixel region PXA1-R. The second silicon transistor S-TFT2 may be connected to the second light emitting element LD2. The second silicon transistor S-TFT2 and the second oxide transistor O-TFT2 might only be partially illustrated among a plurality of transistors connected to the second light emitting element LD2.

As described above, the display panel 100 may include a base layer 110, a circuit layer 120, a light emitting element layer 130, and an encapsulation layer 140.

A buffer layer 10br may be disposed on the base layer 110. The buffer layer 10br may prevent diffusion of metal atoms or impurities from the base layer 110 to upper semiconductor patterns SP1, SP2, SP3, and SP4.

The semiconductor patterns SP1 and SP3 may be disposed on the buffer layer 10br, and the semiconductor patterns SP2 and SP4 may be disposed on the third insulating layer 30. The semiconductor patterns SP1, SP2, SP3, and SP4 may include a silicon semiconductor or an oxide semiconductor.

For example, the silicon semiconductor may include amorphous silicon or polycrystalline silicon, and for example, the semiconductor patterns SP1 and SP3 may include low-temperature polysilicon.

For example, the oxide semiconductor may include a transparent conductive oxide such as indium tin oxide (no), indium zinc oxide (IZO), indium gallium zinc oxide (IGZO), zinc oxide (ZnO), or indium oxide ($In_2O_3$). For example, the semiconductor patterns SP2 and SP4 may include an oxide semiconductor.

The oxide semiconductor may include a plurality of regions divided according to whether transparent conductive oxides are reduced. A region in which a transparent conductive oxide is reduced (hereinafter, reduction region) has greater conductivity than a region in which a transparent conductive oxide is not reduced (hereinafter, non-reduction region). The reduction region substantially serves as a source/drain or signal line of transistors. The non-reduction region substantially corresponds to a semiconductor region (or an active region or a channel) of transistors. For example, a partial region of each of the second semiconductor pattern SP2 and the fourth semiconductor pattern SP4 may be a semiconductor region of transistors, another partial region may be a source region/drain region of transistors, and the other region may be a signal transmission region.

The silicon semiconductor may have different electrical properties according to whether or not doping has been performed therein. The silicon semiconductor may include a first region having high conductivity and a second region having low conductivity. The first region may be doped with an N-type dopant or a P-type dopant. A P-type transistor may include a doped region doped with the P-type dopant, and a N-type transistor may include a doped region doped with the N-type dopant. The second region may be a non-doped region or may be doped in a lower concentration than the first region.

The first region has greater conductivity than the second region and may substantially serve as an electrode or a signal line. The second region may substantially correspond to an active region (or a channel) of the transistor. For example, a portion of the silicon semiconductor pattern may be an active region of the transistor, another portion may be a source or drain of the transistor, and the other portion may be a connection electrode or a connection signal line.

A first silicon transistor S-TFT1 and a first oxide transistor O-TFT1 may be disposed in the first pixel region PXA-R.

A first back metal layer BMLa may be disposed below the first silicon transistor S-TFT1, and a second back metal layer BMLb may be disposed below the first oxide transistor O-TFT1.

The first and second back metal layers BMLa and BMLb respectively overlap the lower portions of the first silicon transistor S-TFT1 and the first oxide transistor O-TFT1, and thus protect the first silicon transistor S-TFT1 and the first oxide transistor O-TFT1. The first and second back metal layers BMLa and BMLb may block an electric potential caused by the polarization of the base layer 110 from affecting the semiconductor patterns SP1, SP2, SP3, and SP4.

The first back metal layer BMLa may be disposed between the base layer 110 and the buffer layer 10br. In an embodiment of the inventive concept, the first back metal layer BMLa may be disposed on the base layer 110 in which an organic layer and an inorganic layer are alternately stacked, and an inorganic barrier layer may be further disposed between the first back metal layer BMLa and the buffer layer 10br. The first back metal layer BMLa may be connected to an electrode or a wiring to receive a constant voltage or a pulse signal therefrom. In an embodiment, the first back metal layer BMLa may be provided in the form isolated from other electrodes or wirings.

The second back metal layer BMLb may correspond to the lower portion of the first oxide transistor O-TFT1. The second back metal layer BMLb may be disposed between the second insulating layer 20 and the third insulating layer 30. The second back metal layer BMLb may be disposed on the same layer as the upper electrode UE. The second back metal layer BMLb may be connected to a contact electrode BML2-C to receive a constant voltage or a pulse signal. The contact electrode BML2-C may be disposed on the same layer as a second gate GT2 of the first oxide transistor O-TFT1.

The first back metal layer BMLa and the second back metal layer BMLb each may include a reflective metal. For example, the first back metal layer BMLa and the second back metal layer BML2b each may include titanium (Ti), molybdenum (Mo), molybdenum-containing alloy, aluminum (Al), aluminum-containing alloy, aluminum nitride (AlN), tungsten (W), tungsten nitride (WN), copper (Cu), and/or p+ doped amorphous silicon. The first back metal layer BMLa and the second back metal layer BMLb may include the same material or different materials.

The first silicon transistor S-TFT1 is disposed on the buffer layer 10br. A source region SE1 (or a source), an active region AC1 (or a channel), and a drain region DE1 (or a drain) of the first silicon transistor S-TFT1 may be formed from the first semiconductor pattern SP1. The source region SE1 and the drain region DE1 may extend in opposite directions from the active region AC1 on a cross section.

The first oxide transistor O-TFT1 is disposed on the third insulating layer 30. A source region SE2 (or a source), an active region AC2 (or a channel), and a drain region DE2 (or a drain) of the first oxide transistor O-TFT1 may be formed from the second semiconductor pattern SP2. The source region SE2 and the drain region DE2 may extend in opposite directions from the active region AC2 on a cross section.

A second silicon transistor S-TFT2 and a second oxide transistor O-TFT2 may be disposed in the second pixel region PXA-R. The second silicon transistor S-TFT2 may have the same structure as the first silicon transistor S-TFT1 and may be formed from the third semiconductor pattern SP3. The second oxide transistor O-TFT2 may have the same structure as the first oxide transistor O-TFT1 and may be formed from the fourth semiconductor pattern SP4. Hereinafter, descriptions will be made based on the first and second semiconductor patterns SP1 and SP2, and the descriptions thereof may be equally applied to the third and fourth semiconductor patterns SP3 and SP4, respectively.

A first insulating layer 10 may be disposed on the buffer layer 10br. The first insulating layer 10 may commonly overlap a plurality of pixels and cover the semiconductor patterns SP1 and SP3. The first insulating layer 10 may be an inorganic layer and/or an organic layer, and have a single or multi-layered structure. The first insulating layer 10 may include aluminum oxide, titanium oxide, silicon oxide, silicon nitride, silicon oxynitride, zirconium oxide, and/or hafnium oxide. In the present embodiment, the first insulating layer 10 may be a single-layered silicon oxide layer. Insulating layers of the circuit layer 120 which will be described later in addition to the first insulating layer 10 may be inorganic layers and/or organic layers and may have a single- or multi-layered structure. The inorganic layer may include at least one of the materials described above but is not necessarily limited thereto.

A first gate GT1 of the first silicon transistor S-TFT1 is disposed on the first insulating layer 10. A second gate GT2 of the first oxide transistor O-TFT1 is disposed on a fourth insulating layer 40 which will be described later. The first gate GT1 and the second gate GT2 may be a portion of a metal pattern.

The gates GT1 and GT2 at least partially overlap the active regions AC1 and AC2. The gates GT1 and GT2 may include titanium (Ti), silver (Ag), silver-containing alloy, molybdenum (Mo), molybdenum-containing alloy, aluminum (Al), aluminum-containing alloy, aluminum nitride (AlN), tungsten (W), tungsten nitride (WN), copper (Cu), indium tin oxide (ITO), indium zinc oxide (IZO), and/or the like, but is not necessarily particularly limited thereto.

A second insulating layer 20 may be disposed on the first insulating layer 10 and may cover the first gate GT1. The third insulating layer 30 may be disposed on the second insulating layer 20. The upper electrode UE, the first back metal layer BMLa, and the second back metal layer BMLb may be disposed between the second insulating layer 20 and the third insulating layer 30.

The upper electrode UE may at least partially overlap the gate GT1 of the first silicon transistor S-TFT1 disposed thereunder. The upper electrode UE may be a portion of a metal pattern or a portion of a doped semiconductor pattern. A portion of the gate GT1 and the upper electrode UE at least partially overlapping the portion may form a storage capacitor. For example, the portion of the gate GT1 may be a first capacitor electrode, and the upper electrode UE may be a second capacitor electrode CE2. However, the upper electrode UE may be omitted.

The fourth insulating layer 40 may be disposed on the third insulating layer 30. For example, the first insulating layer 40 may commonly overlap a plurality of pixels and cover the semiconductor patterns SP2 and SP4. As described above, the second gate GT2 may be disposed on the fourth insulating layer 40.

A fifth insulating layer 50 may be disposed on the fourth insulating layer 40. A first connection electrode CNE1 may be disposed on the fifth insulating layer 50. The first connection electrode CNE1 may be connected to drain regions DE1 and DE2 of the first silicon transistor S-TFT1 and the first oxide transistor O-TFT1 through a contact hole passing through the first to fifth insulating layers 10, 20, 30, 40, and 50.

A sixth insulating layer 60 may be disposed on the fifth insulating layer 50. A second connection electrode CNE2 may be disposed on the sixth insulating layer 60. The second electrode CNE2 may be connected to the first connection electrode CNE1 through a contact hole passing through the sixth insulating layer 60. A seventh insulating layer 70 may be disposed on the sixth insulating layer 60 and may cover the second connection electrode CNE2. An eighth insulating layer 80 may be disposed on the seventh insulating layer 70.

The sixth insulating layer 60, the seventh insulating layer 70, and the eighth insulating layer 80 each may be an organic layer. For example, the sixth insulating layer 60, the seventh insulating layer 70, and the eighth insulating layer 80 each may include benzocyclobutene (BCB), polyimide, hexamethyldisiloxane (HMDSO), general polymers such as polymethylmethacrylate (PMMA) or polystyrene (PS), a polymer derivative having a phenolic group, an acrylic polymer, an imide-based polymer, an aryl ether polymer, an amide-based polymer, a fluorine-based polymer, a p-xylene-based polymer, a vinyl alcohol polymer, and/or a blend thereof.

The first light emitting element LD1 may include a first electrode AE1 (or a pixel electrode), an emission layer EL1, and a second electrode CE (or a common electrode). The second light emitting element LD2 may include a first electrode AE2 (or a pixel electrode), an emission layer EL2, and a second electrode CE or (a common electrode).

In an embodiment, the second electrode CE may be provided in common to the first light emitting element LD1, the second light emitting element LD2, and the third light emitting element LD3. Alternatively, in an embodiment, a portion of the second electrode CE may be patterned to correspond to the emission layers EL1 and EL2.

The first electrode AE1 of the first light emitting element LD1 and the first electrode AE2 of the second light emitting element LD2 may be disposed on the eighth insulating layer 80. The first electrodes AE1 and AE2 each may be a transmissive electrode, a transflective electrode, or a reflective electrode. According to an embodiment of the inventive concept, the first electrodes AE1 and AE2 each may include Ag, Mg, Cu, Al, Pt, Pd, Au, Ni, Nd, Ir, Cr, Li, Ca, LiF, Mo, Ti, W, In, Sn, and/or Zn, two or more compounds selected therefrom, two or more mixtures selected therefrom, or an oxide thereof.

When the first electrodes AE1 and AE2 are the transmissive electrode, the first electrodes AE1 and AE2 each may include a transparent metal oxide such as indium tin oxide (ITO), indium zinc oxide (IZO), zinc oxide (ZnO), and indium tin zinc oxide (ITZO). When the first electrodes AE1 and AE2 are the transflective electrode or the reflective electrode, the first electrodes AE1 and AE2 each may include Ag, Mg, Cu, Al, Pt, Pd, Au, Ni, Nd, Ir, Cr, Li, Ca, LiF/Ca (a stack structure of LiF and Ca), LiF/Al (a stack structure of LiF and Al), Mo, Ti, W, a compound thereof, or a mixture thereof (e.g., a mixture of Ag and Mg). Alternatively, the first electrodes AE1 and AE2 each may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the first electrodes AE1 and AE2 may have a three-layer structure of ITO/Ag/ITO, but are not necessarily limited thereto.

The pixel definition layer PDL may be disposed on the eighth insulating layer 80. The pixel definition layer PDL may have light absorption properties, and for example, the pixel definition layer PDL may be black in color. The pixel definition layer PDL may include a black coloring agent. The black coloring agent may include a black dye and a black pigment. The black coloring agent may include carbon black, a metal such as chromium, or an oxide thereof. The pixel definition layer PDL may correspond to a light blocking pattern having light blocking properties.

The pixel definition layer PDL may cover a portion of the first electrode AE1 of the first light emitting element LD1 and a portion of the first electrode AE2 of the second light emitting element LD2. For example, in the pixel definition layer PDL, first pixel openings PDL-OP1 exposing the first electrode AE1 of the first light emitting element LD1 or the first electrode AE2 of the second light emitting element LD2 may be defined. However, the embodiment is not necessarily limited thereto, and three or more light emitting elements may be provided, and the first pixel openings PDL-OP1 may each expose the first electrodes included in the plurality of light emitting elements. A region corresponding to the first pixel openings PDL-OP1 may be defined as an emission area LA. In the light emitting region LA, light generated from the first light emitting element LD1 or the second light emitting element LD2 may be emitted. A region at least partially surrounding the light emitting region LA and at least partially overlapping the pixel definition layer PDL may be defined as a non-light emitting region NLA. The non-light emitting region NLA may be a light absorbing region.

In an embodiment, the display panel 100 may include the light emitting region LA and the non-light emitting region NLA. However, the embodiment is not necessarily limited thereto, and the display panel 100 may further include an additional region other than the light emitting region LA and the non-light emitting region NLA.

A hole control layer may be disposed between the first electrode AE1 and the emission layer EL1, and between the first electrode AE2 and the emission layer EL2. The hole control layer may include a hole transport layer and may further include a hole injection layer. An electron control layer may be disposed between the emission layers EL1 and EL2 and the second electrode CE. The electron control layer may include an electron transport layer and may further include an electron injection layer. The hole control layer and the electron control layer may be commonly formed in the plurality of pixels PX (see FIG. 6) using an open mask.

The second electrode CE may include Ag, Mg, Cu, Al, Pt, Pd, Au, Ni, Nd, Ir, Cr, Li, Ca, LiF, Mo, Ti, W, In, Sn, and/or Zn, two or more compounds selected therefrom, two or more mixtures selected therefrom, or an oxide thereof.

The second electrode CE may be a transmissive electrode, a transflective electrode, or a reflective electrode. When the second electrode CE is a transmissive electrode, the second electrode CE may be formed of a transparent metal oxide, for example, indium tin oxide (ITO), indium zinc oxide (IZO), zinc oxide (ZnO), indium tin zinc oxide (ITZO), etc.

When the second electrode CE is the transflective electrode or the reflective electrode, the second electrode CE may include Ag, Mg, Cu, Al, Pt, Pd, Au, Ni, Nd, Jr, Cr, Li, Ca, LiF/Ca (a stack structure of LiF and Ca), LiF/Al (a stack structure of LiF and Al), Mo, Ti, W, a compound thereof, or a mixture thereof (e.g., AgMg, AgYb, or MgYb). Alternatively, the second electrode CE may have a multilayer structure including a reflective film or a transflective film formed of the above-described materials, and a transparent conductive film formed of indium tin oxide (ITO), indium zinc oxide (IZO), zinc oxide (ZnO), indium tin zinc oxide (ITZO), etc. For example, the second electrode CE may include the above-described metal materials, a combination of two or more metal materials selected from the above-described metal materials, or oxides of the above-described metal materials.

The encapsulation layer 140 may be disposed on the light emitting element layer 130. The encapsulation layer 140 may include an inorganic layer 141, an organic layer 142, and an inorganic layer 143 which are sequentially stacked, but the layers forming the encapsulation layer 140 are not necessarily limited thereto.

The inorganic layers 141 and 143 may protect the light emitting element layer 130 from moisture and oxygen, and the organic layer 142 may protect the light emitting element layer 130 from foreign substances such as dust particles. The inorganic layers 141 and 143 may include a silicon nitride layer, a silicon oxy nitride layer, a silicon oxide layer, a titanium oxide layer, or an aluminum oxide layer. The organic layer 142 may include an acryl-based organic layer, but the embodiment of the inventive concept is not necessarily limited thereto.

The sensor layer 200 may be disposed on the display panel 100. The sensor layer 200 may be referred to as a sensor, an input sensing layer, or an input sensing panel. The sensor layer 200 may include a base layer 210 a first conductive layer 220, a first sensing insulating layer 230, a second conductive layer 240, and a second sensing insulating layer 250.

The base layer 210 may be directly disposed on the display panel 100. The base layer 210 may be an inorganic layer including silicon nitride, silicon oxynitride, and/or silicon oxide. Alternatively, the base layer 210 may be an organic layer including an epoxy resin, an acrylic resin, or an imide-based resin. The base layer 210 may have a single-layered structure or may have a multi-layered structure stacked along the third direction DR3.

The first conductive layer 220 and the second conductive layer 240 each may have a single-layered structure or may have a multi-layered structure stacked along the third direction DR3. The first conductive layer 220 and the second conductive layer 240 may include conductive lines that define a sensing electrode having a mesh shape. The conductive lines might not overlap the first pixel opening PDL-OP1 and the second pixel opening PDL-OP2 which will be described later, and may at least partially overlap pixel definition layers PDL.

The single-layered conductive layer may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), or indium zinc tin oxide (IZTO). In addition, the transparent conductive layer may include a conductive polymer such as PEDOT, a metal nanowire, graphene, etc.

The conductive layer having a multi-layered structure may include metal layers. The metal layers may have a three-layer structure of, for example, titanium/aluminum/titanium. The multi-layered conductive layer may include at least one metal layer and at least one transparent conductive layer.

The first sensing insulating layer 230 may be disposed between the first conductive layer 220 and the second conductive layer 240. The first sensing insulating layer 230 may include an inorganic film. The inorganic layer may include aluminum oxide, titanium oxide, silicon oxide, silicon nitride, silicon oxynitride, zirconium oxide, and/or hafnium oxide.

The first sensing insulating layer 230 may include an organic film. The organic layer may include an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, and/or a perylene-based resin.

The first conductive layer 220 or the second conductive layer 240 may have touch openings MH1-R and MH1-G formed in the touch electrode YT1 described in FIG. 7. For example, in the touch electrode YT1, the first touch opening MH1-R at least partially overlapping the first light emitting element LD1 is formed, and the second touch opening MH1-G at least partially overlapping the second light emitting element LD2 is formed.

In an embodiment, the second conductive layer 240 may have a first width L1. The first width L1 of the second conductive layer 240 may be the same as the first width L1 of the first portion PT1 described in FIG. 7.

The second sensing insulating layer 250 may cover the second conductive layer 240. The second sensing insulating layer 250 may flatten an upper surface of the sensor layer 200.

The second sensing insulating layer 250 may include an inorganic film. The inorganic layer may include aluminum oxide, titanium oxide, silicon oxide, silicon nitride, silicon oxynitride, zirconium oxide, and/or hafnium oxide.

The second sensing insulating layer 250 may include an organic film. The organic layer may include an acrylic-based resin, a methacrylate-based resin, polyisoprene, a vinyl-based resin, an epoxy-based resin, a urethane-based resin, a cellulose-based resin, a siloxane-based resin, a polyimide-based resin, a polyamide-based resin, and/or a perylene-based resin.

The anti-reflection layer 300 may be disposed on the sensor layer 200. The anti-reflection layer 300 may include a light blocking layer 310, the color filter CF (see FIG. 7), and a planarization layer 330.

The light blocking layer 310 is disposed on the second sensing insulating layer 250. At least a portion of the light blocking layer 310 may at least partially overlap the second conductive layer 240.

The light blocking layer 310 may cover the second conductive layer 240. For example, the second conductive layer 240 may have a first width L1, and the light blocking layer 310 covering the second conductive layer 240 may have a first light blocking layer width D1. The light blocking layer 310 covers the second conductive layer 240, and thus may prevent the second conductive layer 240 from being viewed from the outside.

Materials constituting the light blocking layer 310 are not particularly limited as long as the materials absorb light. The light blocking layer 310 is a layer which is black in color, and in an embodiment, the light blocking layer 310 may include a black coloring agent. The black coloring agent may include a black dye and/or a black pigment. The black coloring agent may include carbon black, a metal such as chromium, or an oxide thereof.

The light blocking layer 310 may cover the second conductive layer 240 of the sensor layer 200.

In an embodiment, a light blocking layer opening 310-OP may be defined in the light blocking layer 310. The light blocking layer opening 310-OP may be provided in plural, and for example, the light blocking layer opening 310-OP may include a first light blocking layer opening 310-OP1 at least partially overlapping the first light emitting element LD1, and a second light blocking layer at least partially opening 310-OP2 at least partially overlapping the second light emitting element LD2. As described above in FIG. 7, a region at least partially overlapping the light blocking layer openings 310-OP1 and 310-OP2 may be defined as a pixel region PXA. A region at least partially surrounding the pixel region PXA and at least partially overlapping the light blocking layer 310 may be defined as a peripheral region NPXA.

The display panel 100 may include the pixel region PXA and the peripheral region NPXA. However, the embodiment is not necessarily limited thereto, and the display panel 100 may further include an additional region other than the pixel region PXA and the peripheral region NPXA.

In an embodiment, the pixel region PXA may include a first pixel region PXA-R at least partially overlapping the first light emitting element LD1 and a second pixel region PXA-G at least partially overlapping the second light emitting element LD2. The peripheral region NPXA may be disposed adjacent to the first pixel region PXA-R and the second pixel region PXA-G. The peripheral region NPXA may be a region at least partially overlapping the light blocking layer 310. The peripheral region NPXA may be a region that does not provide light to users.

The pixel region PXA may be larger than the light emitting region LA, and the peripheral region NPXA may be smaller than the non-light emitting region NLA.

In an embodiment, the color filter CF (see FIG. 7) may include a first color filter 321 and a second color filter 322. The first color filter 321 and the second color filter 322 may be separated from each other by the light blocking layer 310.

The first color filter 321 may at least partially overlap the first pixel region PXA-R. The first color filter 321 may at least partially overlap the first electrode AE1 of the first light emitting element LD1 and cover the first light blocking layer opening 310-OP1. For example, the first color filter 321 may cover the first light blocking layer opening 310-OP1 and may contact at least a portion of the light blocking layer 310. The first color filter 321 may at least partially overlap a portion of the peripheral region NPXA. In an embodiment, the first color filter 321 may be red in color.

The second color filter 322 may at least partially overlap the second pixel region PXA2-G. The second color filter 322 may at least partially overlap the first electrode AE2 of the second light emitting element LD2 and cover the second light blocking layer opening 310-OP2. For example, the second color filter 322 may cover the second light blocking layer opening 310-OP2 and may contact at least a portion of the light blocking layer 310. The second color filter 322 may at least partially overlap a portion of the peripheral region NPXA. In an embodiment, the second color filter 322 may be green in color.

The color filter CF (see FIG. 7) may further include a third color filter at least partially overlapping the third pixel region PXA-B (FIG. 7). The third color filter may have a different color from the first color filter 321 and the second color filter 322, and for example, the third color filter may be blue in color.

The planarization layer 330 may cover the light blocking layer 310, the first color filter 321, and the second color filter 322. The planarization layer 330 may include an organic material and may provide a flat surface on an upper surface of the planarization layer 330. In an embodiment of the inventive concept, a planarization layer 330 may be omitted.

Figure 9:
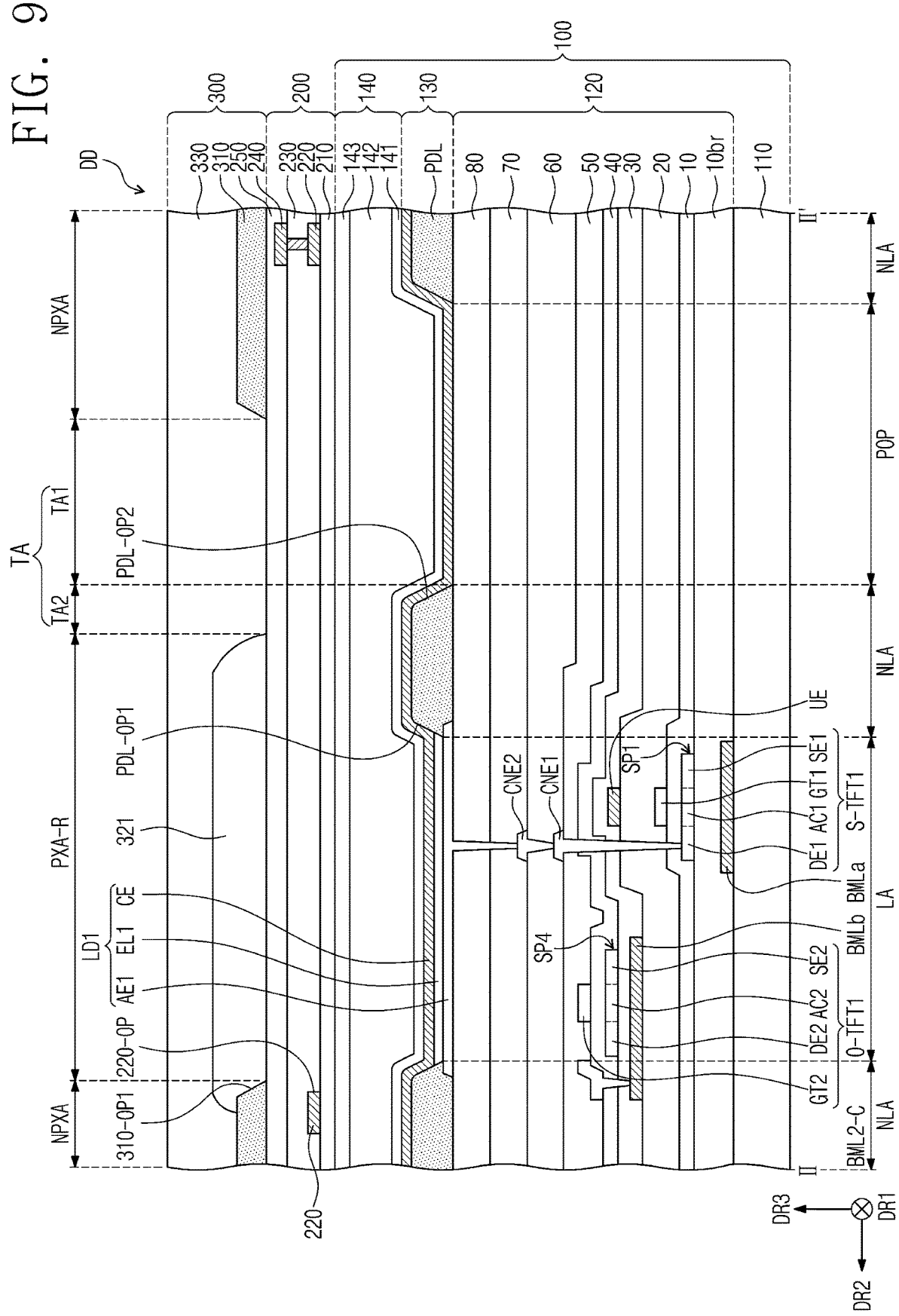
FIG. 9 is a cross-sectional view corresponding to II-II' of FIG. 7.

FIG. 9 is a cross-sectional view corresponding to II-II' of FIG. 7.

FIG. 9 is a cross-sectional view of an embodiment of the peripheral region NPXA, the first pixel region PXA-R, and the light blocking layer opening region TA.

Referring to FIG. 9, in the pixel definition layer PDL, a first pixel opening PDL-OP1 exposing the first electrodes AE1 and AE2 and a second pixel opening PDL-OP2 spaced apart from the first pixel opening PDL-OP1 may be defined. As described above in FIG. 8, a region corresponding to the first pixel opening PDL-OP1 may be defined as the light emitting region LA.

A region corresponding to the second pixel opening PDL-OP2 may be defined as a pixel definition layer opening region POP. The pixel definition layer opening region POP might not overlap the light emitting elements LD1 and LD2, and accordingly, does not emit light. In addition, the pixel definition layer opening region POP might not overlap the pixel definition layer PDL, and accordingly, does not absorb light. The pixel definition layer opening region POP may be a region through which external light passes through the display panel 100 through the second pixel opening PDL-OP2.

The display panel 100, according to an embodiment, may include the light emitting region LA, the pixel definition layer opening region POP, and the non-light emitting region NLA.

The first light blocking layer opening 310-OP1 may be defined in the light blocking layer 310. In an embodiment, a region that does not overlap the light blocking layer 310 and at least partially overlaps the first color filter 321 may be defined as a first pixel region PXA-R. The first pixel region PXA-R may at least partially overlap the first light emitting element LD1, and the first color filter 321 covering the first light emitting element LD1.

In an embodiment, a region that does not overlap the light blocking layer 310 and the first color filter 321 may be defined as the light blocking layer opening region TA. For example, the first pixel region PXA-R and the light blocking layer opening region TA may at least partially overlap the first light blocking layer opening 310-OP1. A portion of the light blocking layer opening region TA may at least partially overlap a portion of the pixel definition layer opening region POP. In the second direction DR2, the pixel definition layer opening region POP may have a greater width than the light blocking layer opening region TA.

A region at least partially surrounding the first pixel region PXA-R and the light blocking layer opening region TA may be defined as a peripheral region NPXA. The peripheral region NPXA may be a region at least partially overlapping the light blocking layer 310.

Referring to FIGS. 8 and 9 together, the peripheral region NPXA may be a region at least partially surrounding the pixel region PXA including the first pixel region PXA-R and the second pixel region PXA-G, and the light blocking layer opening region TA.

In an embodiment, the display panel 100 may include a pixel region PXA, a light blocking layer opening region TA, and a peripheral region NPXA. The light blocking layer opening region TA may include a transmission region TA1 and a margin region TA2.

In an embodiment, the first color filter 321 may at least partially overlap the first pixel region PXA-R, and both ends of the first color filter 321 may contact the light blocking layer 310 or the second sensing insulating layer 250, respectively.

For example, one end of the first color filter 321 may contact the light blocking layer 310 in the peripheral region NPXA disposed on the left side of the first pixel region PTXA-R.

For example, the other end of the first color filter 321 may contact the second sensing insulating layer 250 in the first pixel region PTXA-R.

The light blocking layer opening region TA may be a region at least partially overlapping the light blocking layer opening 310-OP1 and not overlapping the first color filter 321. The light blocking layer opening region TA may be positioned adjacent to the first pixel region PTXA-R.

The light blocking layer opening region TA includes a transmission region TA1 that does not overlap the pixel definition layer PDL. In an embodiment, the light blocking layer opening region TA may further include a margin region TA2 at least partially overlapping the pixel definition layer PDL in addition to the transmission region TA1.

The transmission region TA1 may at least partially overlap the pixel definition layer opening region POP, and the margin region TA2 may at least partially overlap the non-light emitting region NLA. For example, the transmissive region TA1 may at least partially overlap a portion of the pixel definition layer opening region POP, and the margin region TA2 may at least partially overlap a portion of the non-light emitting region NLA.

The transmission region TA1 is a region in which all structures that lead to reduction in light transmittance, including a light blocking structure, are removed. For example, in the transmission region TA1, the transistors S-TFT1, O-TFT1, S-TFT2, and O-TFT2 of the circuit layer 120, the pixel definition layer PDL, the first electrodes AE1 and AE2, and the emission layers EL1 and EL2 of the light emitting element layer 130, the first conductive layer 220 and the second conductive layer 240 of the sensor layer 200, and the color filters 321 and 322 and the light blocking layer 310 of the anti-reflection layer 300 might not be disposed. The second electrode CE may be disposed in the transmission region TA1, and functional layers such as a hole control layer and a hole transport layer, described above, may be disposed.

Unlike the transmission region TA1, the margin region TA2 at least partially overlaps the pixel definition layer PDL. For example, in the margin region TA2, the transistors S-TFT1, O-TFT1, S-TFT2, and O-TFT2 of the circuit layer 120, the first electrodes AE1 and AE2 and the emission layers EL1 and EL2 of the light emitting element layer 130, the first conductive layer 220 and the second conductive layer 240 of the sensor layer 200, and the color filters 321 and 322 and the light blocking layer 310 of the anti-reflection layer 300 might not be disposed. The second electrode CE may be disposed in the margin region TA2, and functional layers such as a hole control layer and a hole transport layer, described above, may be disposed.

The margin region TA2 may be spaced apart from the first color filter 321 and the transmission region TA1. The margin region TA2 is a region designed to prevent the first color filter 321 from overlapping the transmission region TA1 due to process errors or the like.

The display device DD of the inventive concept includes the margin region TA2, and thus may secure the transmission region TA1 that does not overlap the first color filter 321. However, the embodiment of the inventive concept is not necessarily limited to FIG. 9, and in an embodiment, the margin region TA2 may be omitted. In this case, the first color filter 321 may extend in a direction opposite to the second direction DR2 to have the same boundary as the pixel definition layer PDL. When the margin region TA2 is omitted, the light blocking layer opening region TA may be the same region as the transmission region TA1, and the pixel region PXA-R may extend to the margin region TA2.

The transmission region TA1 may be a sensing region of an optical sensor. For example, the transmission region TA1 may be a sensing region of an optical sensor such as the sensor module SM (FIG. 2). The light blocking layer opening region TA including the transmission region TA1 may be a sensing region of an optical sensor.

The display device DD of the inventive concept includes the transmission region TA1 in the first active region 100SA (see FIG. 2), and thus may increase the light transmittance of the first active region 100SA (see FIG. 2).

The electronic device 1000 (see FIG. 2) of the inventive concept includes the first active region 100SA (see FIG. 2) including the transmission region TA1, and thus may transmit a greater amount of light to an electronic module such as the sensor module SM (FIG. 2).

Figure 10:
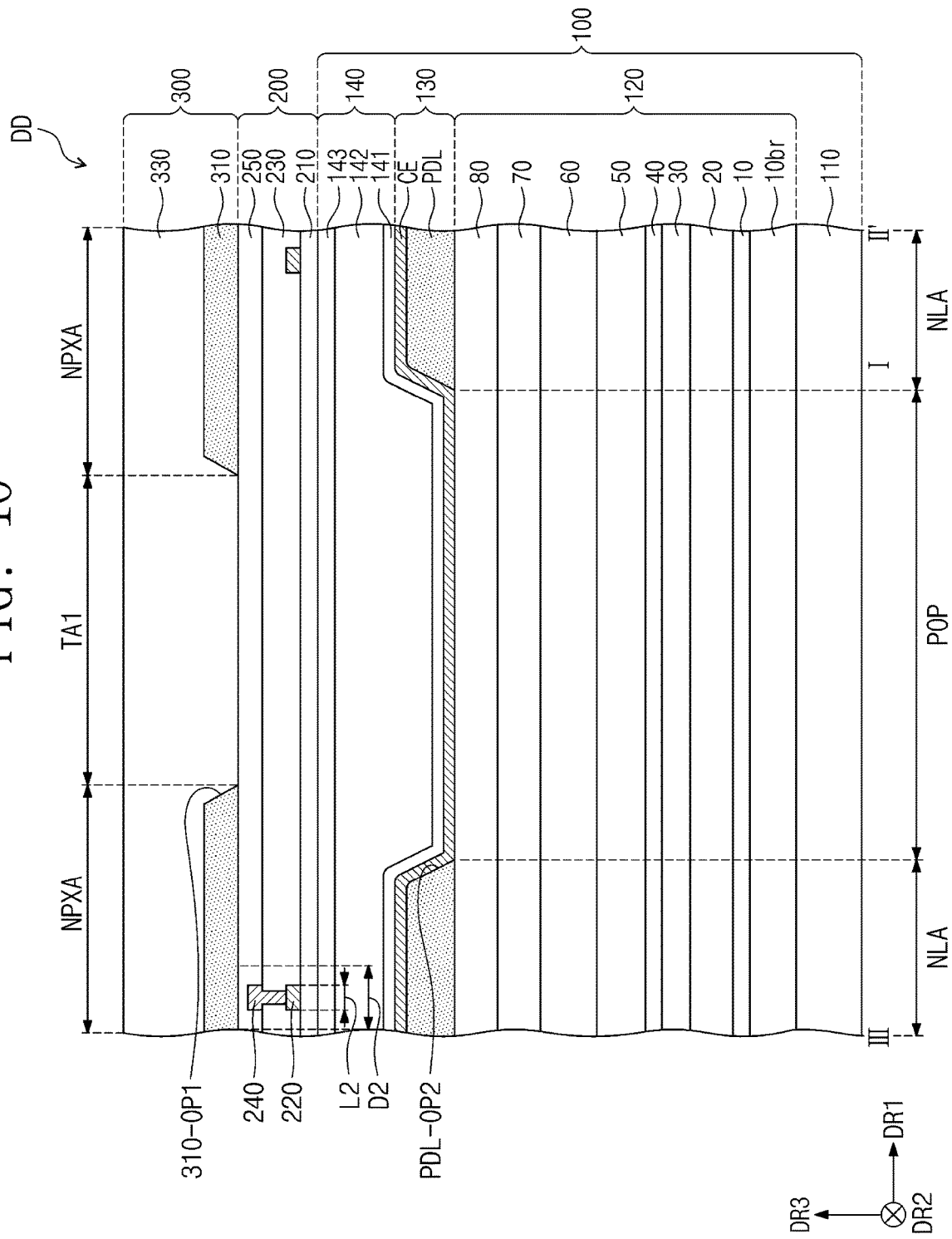
FIG. 10 is a cross-sectional view corresponding to III-III' of FIG. 7.

FIG. 10 is a cross-sectional view corresponding to III-III' of FIG. 7.

FIG. 10 is a cross-sectional view of an embodiment of the transmission region TA1.

Referring to FIG. 10, the transmission region TA1 may be disposed between the peripheral regions NPXA in the first direction DR1.

The first light blocking layer opening 310-OP1 may be defined in the light blocking layer 310. A region at least partially overlapping the first light blocking layer opening 310-OP1 and not overlapping the pixel definition layer PDL may be defined as a transmission region TA1. A separate color filter might not be disposed in the transmission region TA1.

A second pixel opening PDL-OP2 may be defined in the pixel definition layer PDL. A region at least partially overlapping the second pixel opening PDL-OP2 may be defined as a pixel definition layer opening region POP.

Descriptions of the transmission region TA1 and the pixel definition layer opening region POP may be the same as described above in FIGS. 8 and 9.

In the first direction DR1, the transmission region TA1 may have a smaller width than the pixel definition layer opening region POP. For example, the transmission region TA1 may at least partially overlap a portion of the pixel definition layer opening region POP.

In an embodiment, the second conductive layer 240 disposed adjacent to the transmission region TA1 may have a second width L2. The light blocking layer 310 may cover the second conductive layer 240, and the light blocking layer 310 may have a second light blocking layer width D2.

Referring to FIGS. 8 and 10 together, the second width L2 of the second conductive layer 240 illustrated in FIG. 10 may be smaller than the first width L1 of the second conductive layer 240 illustrated in FIG. 8.

Accordingly, the light blocking layer 310 covering the second conductive layer 240 may have a second light blocking layer width D2 that is smaller than the first light blocking layer width D1. When the width of the second conductive layer 240 decreases from the first width L1 to the second width L2, the width of the light blocking layer 310 covering the second conductive layer 240 may also decrease from the first light blocking layer width D1 to the second light blocking layer width D2.

The second width L2 of the second conductive layer 240 illustrated in FIG. 10 may be the same as the width of the second portion PT2 illustrated in FIG. 7.

When the width of the second conductive layer 240 disposed adjacent to the transmission region TA1 has a second width L2 smaller than the first width L1 (see FIG. 8), a space for the transmission region TA1 may be secured in the first active region 100SA (see FIG. 6).

However, the embodiment of the inventive concept is not necessarily limited thereto.

For example, any one of the two conductive layers 220 and 240 illustrated in FIG. 10 may be omitted. For example, the first conductive layer 220 and the second conductive layer 240 disposed in a direction opposite to the first direction DR1 in the transmission region TA1 may be omitted, and the first conductive layer 220 disposed in the first direction DR1 in the transmission region TA1 may be kept. Alternatively, the first conductive layer 220 and the second conductive layer 240 disposed in a direction opposite to the first direction DR1 in the transmission region TA1 may be kept, and the first conductive layer 220 disposed in the first direction DR1 in the transmission region TA1 may be omitted. Accordingly, the transmission region TA1 may be further expanded.

The transmission region TA1 may be a region that does not overlap the transistors TFT1 and TFT2, the pixel definition layer PDL, the first electrodes AE1 and AE2, emission EL1 and EL2, the first conductive layer 220, the second conductive layer 240, the first color filter 321, and the light blocking layer 310. Accordingly, the light blocking layer opening region TA (see FIG. 9) including the transmission region TA1 may have higher light transmittance than the first pixel region PXA-R (see FIG. 9), the second pixel region PXA-G (see FIG. 9), and the peripheral region NPXA.

The display device DD of the inventive concept includes the transmission region TA1, and thus may increase the light transmittance of the first active region 100SA The electronic device 1000 (see FIG. 2) of the inventive concept includes the transmission region TA1, and thus may effectively transmit light to an electronic module such as the sensor module SM (see FIG. 2).

Figure 11:
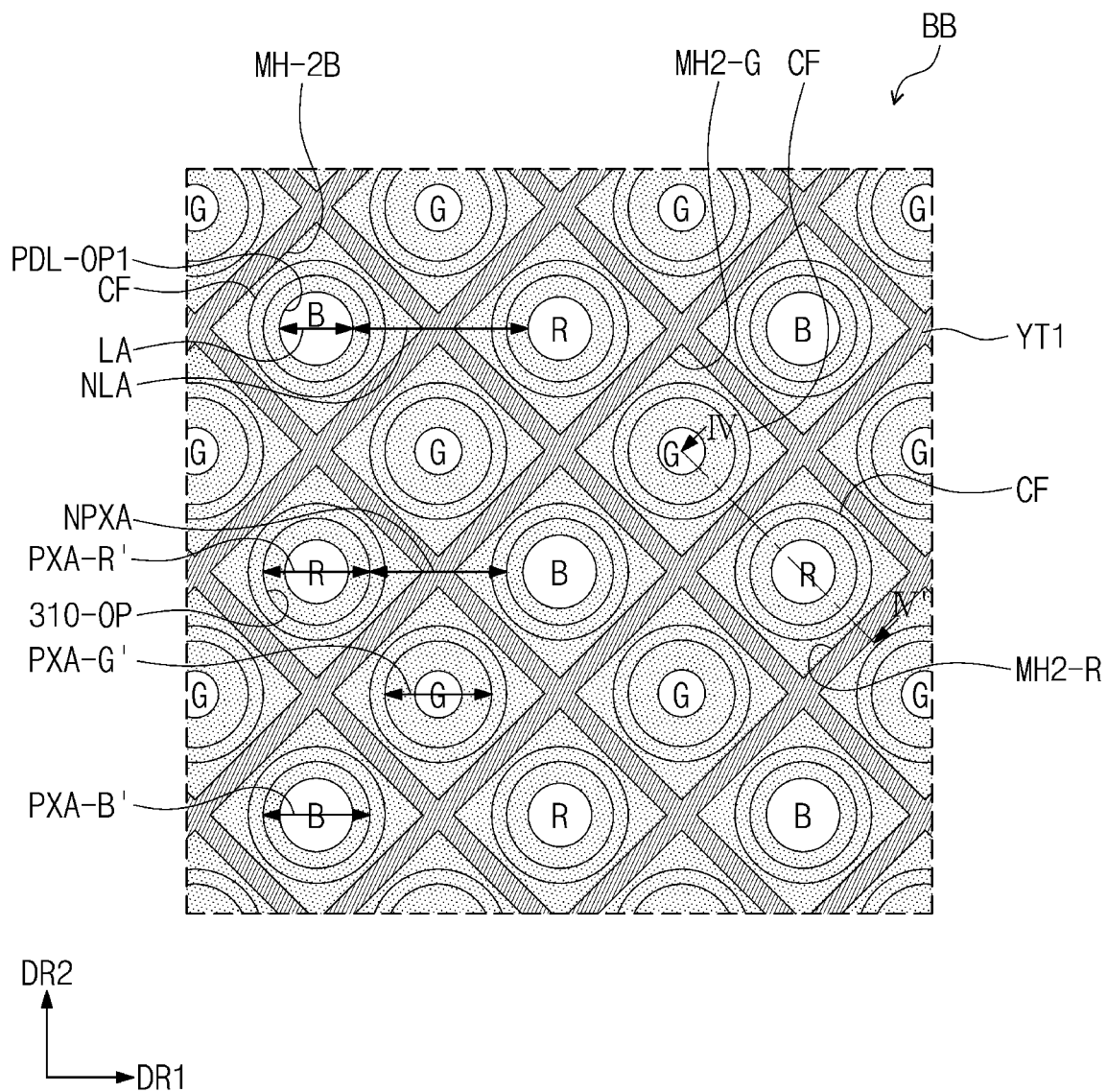
FIG. 11 is a cross-sectional view enlarging region BB of FIG. 6.

FIG. 11 is a cross-sectional view enlarging region BB of FIG. 6.

FIG. 11 is a view enlarging a portion of the second active region 100AA illustrated in FIG. 6.

Referring to FIG. 11, the second active region 100AA (see FIG. 6) may include first to third pixel regions PXA-R', PXA-G', and PXA-B'.

A first touch opening MH2-R, a second touch opening MH2-G, and a third touch opening MH2-B may be defined in the touch electrode YT1. The first touch openings MH2-R, the second touch openings MH2-G, and the third touch openings MH2-B may expose the first to third pixel regions PXA-R', PXA-G', and PXA-B', respectively.

Compared to the first active region 100SA illustrated in FIG. 7, the second active region 100AA (see FIG. 6) might not include the light blocking layer opening region TA (see FIG. 7).

Figure 12:
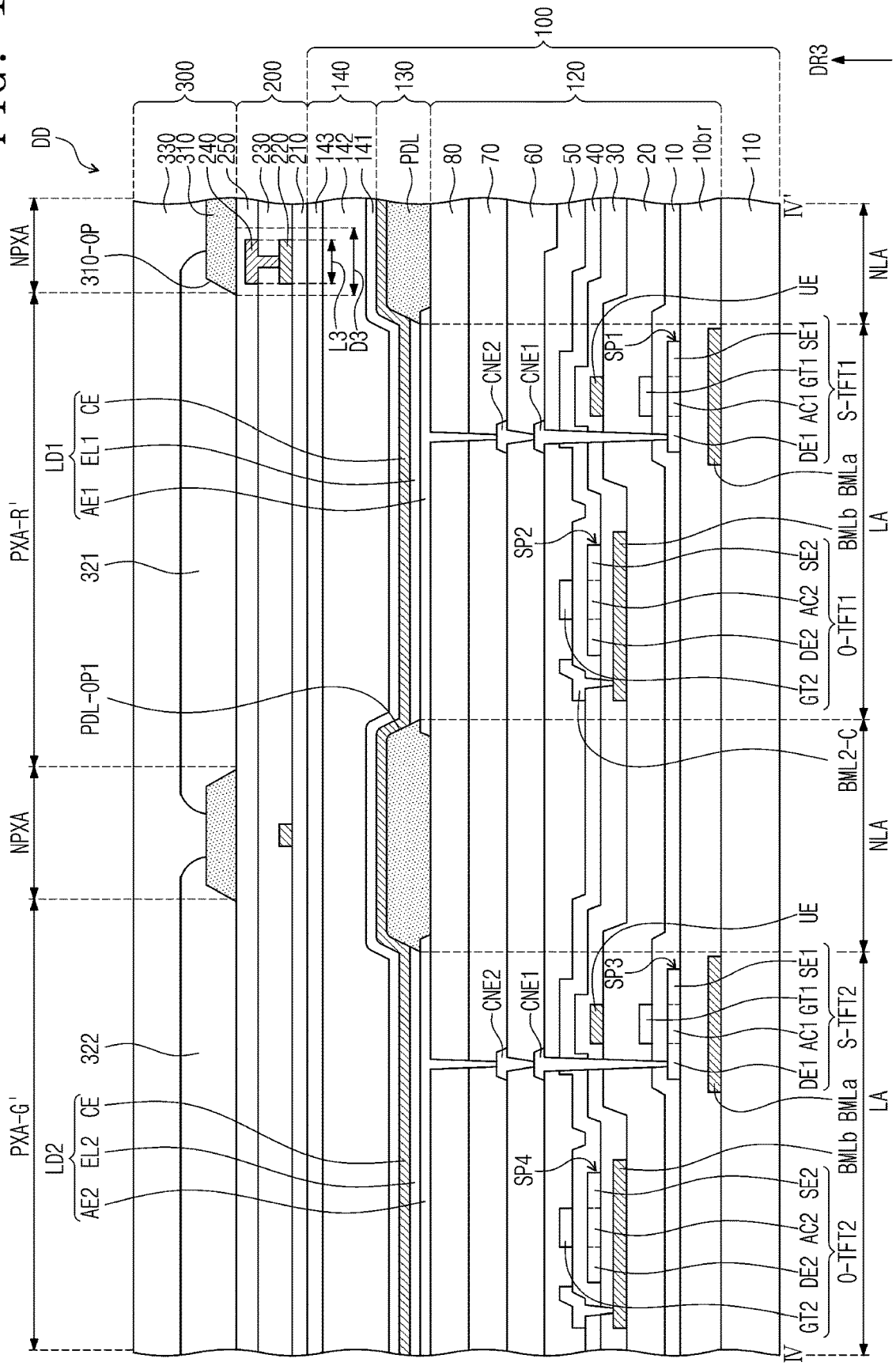
FIG. 12 is a cross-sectional view corresponding to IV-IV' of FIG. 11.

FIG. 12 is a cross-sectional view corresponding to IV-IV' of FIG. 11.

FIG. 12 is a cross-sectional view of the first pixel region PXA-R', the second pixel region PXA-G', and the peripheral region NPXA included in the second active region 100AA (see FIG. 6).

The second active region 100AA (see FIG. 6) does not include the light blocking layer opening region TA.

In an embodiment, the light blocking layer opening 310-OP at least partially overlapping the first light emitting element LD1 and the second light emitting element LD2 may be defined in the light blocking layer 310. A region corresponding to the light blocking layer opening 310-OP is defined as a first pixel region PXA-R' and a second pixel region PXA-G'. A region at least partially overlapping the light blocking layer 310 is defined as a peripheral region NPXA.

In an embodiment, in the pixel definition layer PDL, the pixel opening PDL-OP1 exposing the first electrode AE1 of the first light emitting element LD1 and the first electrode AE2 of the second light emitting element LD2 may be defined. A region corresponding to the pixel opening PDL-OP1 is defined as a light emitting region LA, and a region corresponding to the pixel definition layer PDL is defined as a non-light emitting region NLA.

The third width L3 of the second conductive layer 240 may be the same as the first width L1 (see FIG. 8) of the second conductive layer 240. In the present description, the second active region 100AA (see FIG. 6) does not include the light blocking layer opening region TA (see FIG. 7), the third width L3 of the second conductive layer 240 is equal to the first width L1 (see FIG. 8) of the second conductive layer 240.

The third light blocking layer width D3 of the light blocking layer 310 covering the second conductive layer 240 may be equal to the first light blocking layer width D1.

In the present description, the second active region 100AA (see FIG. 6) does not include the light blocking layer opening region TA (see FIG. 7), and thus may have lower light transmittance than the first active region 100SA (see FIG. 6).

The resolution of the second active region 100AA may be equal to or higher than that of the first active region 100SA.

The display device, according to an embodiment of the inventive concept, includes the first active region 100SA including the transmission region TA1, and thus may exhibit high light transmittance in a specific region.

The electronic device, according to an embodiment of the inventive concept, includes the first active region 100SA including the transmission region TA1, and thus may increase light transmittance and make an electronic module more reliable.

A display device of the present disclosure may increase the transmittance of a sensor region.

An electronic device of the present disclosure may have increased reliability. Although the inventive concept has been described with reference to a preferred embodiment of the inventive concept, it will be understood that the inventive concept should not necessarily be limited to these preferred embodiments but various changes and modifications can be made by those skilled in the art without departing from the spirit and scope of the inventive concept.

What is claimed is:

1. A display device, comprising:
a display panel including a first pixel region having a first light emitting element disposed therein, a second pixel region adjacent to the first pixel region in a first direction and having a second light emitting element disposed therein, and a light blocking layer opening region being adjacent to the first pixel region in a second direction crossing the first direction;
a sensor layer disposed on the display panel, the sensor layer including a touch electrode; and
an anti-reflection layer disposed on the sensor layer including color filters and a light blocking layer,
wherein the light blocking layer opening region does not overlap with the color filters and the light blocking layer in a vertical projection, wherein the light blocking layer opening region comprises a transmission region, and the transmission region is spaced apart from the first pixel region, wherein the touch electrode includes a first portion having a first width and a second portion having a second width that is smaller than the first width, and wherein the first portion is disposed between the first light emitting element and the second light emitting element, and the second portion is disposed between the transmission region and the second pixel region.

2. The display device of claim 1, wherein the touch electrode further includes a third portion connecting the first portion to the second portion, wherein the third portion is disposed between the transmission region and the second pixel region, and wherein the third portion has a width gradually decreasing from the first width to the second width in a direction from the first portion to the second portion.

3. The display device of claim 1, wherein a direction of extension of the first portion is different from a direction of extension of the second portion.

4. The display device of claim 1, wherein the color filters include a first color filter that covers the first light emitting element, and a second color filter that covers the second light emitting element, and wherein the light blocking layer includes a light blocking material.

5. The display device of claim 1, wherein a first light blocking layer opening defined in the light blocking layer at least partially overlaps the first light emitting element and a second light blocking layer opening defined in the light blocking layer at least partially overlaps the second light emitting element.

6. The display device of claim 5, wherein the display panel further comprises a peripheral region at least partially surrounding the first pixel region, the second pixel region, and the light blocking layer opening region, and wherein the first pixel region at least partially overlaps the first light blocking layer opening and the first color filter, the second pixel region at least partially overlaps the second light blocking layer opening and the second color filter, and the light blocking layer opening region at least partially overlaps the first light blocking layer opening.

7. The display device of claim 6, wherein the touch electrode at least partially overlaps the peripheral region.

8. The display device of claim 6, wherein:

a plurality of touch openings is defined in the touch electrode;

any one of the plurality of touch openings at least partially overlaps the first pixel region and the light blocking layer opening region;

another one of the plurality of touch openings at least partially overlaps the second pixel region; and the touch electrode at least partially overlaps the peripheral region.

9. The display device of claim 6, wherein:

the display panel further comprises a pixel definition layer in which a plurality of first pixel openings and a plurality of second pixel openings are defined;

the first light emitting element and the second light emitting element at least partially overlap any one of the plurality of first pixel openings; and none of the plurality of second pixel openings overlap either the first light emitting element or the second light emitting element.

10. The display device of claim 9, wherein the transmission region at least partially overlaps any one of the plurality of second pixel openings.

11. The display device of claim 10, wherein the light blocking layer opening region further comprises a margin region that at least partially overlaps the pixel definition layer.

12. The display device of claim 10, wherein the display panel comprises a light emitting region corresponding to the plurality of first pixel openings, a pixel definition layer opening region corresponding to the plurality of second pixel openings, and a non-light emitting region at least partially surrounding the light emitting region and the pixel definition layer opening region.

13. The display device of claim 12, wherein the transmission region at least partially overlaps a portion of the pixel definition layer opening region.

14. A display device, comprising:

a display panel including a first pixel region having a first light emitting element disposed therein, a second pixel region adjacent to the first pixel region in a first direction and having a second light emitting element disposed therein, and a light blocking layer opening region being adjacent to the first pixel region in a second direction crossing the first direction;

a sensor layer including a touch electrode disposed on the display panel and having a first touch opening exposing both the first pixel region and the light blocking layer opening region and a second touch opening exposing the second pixel region; and an anti-reflection layer disposed on the sensor layer including color filters and a light blocking layer, wherein the light blocking layer opening region does not overlap with the color filters and the light blocking layer in a vertical projection, wherein the light blocking layer opening region comprises a transmission region, and the transmission region is spaced apart from the first pixel region, and wherein a width of a portion of the touch electrode that is adjacent to the transmission region is smaller than a width of a portion of the touch electrode that is adjacent to the first pixel region and the second pixel region.

15. The display device of claim 14, wherein light blocking layer openings are defined in the light blocking layer, and the light blocking layer openings overlap the first pixel region, and the second pixel region, and the light blocking layer opening region, and wherein the display panel further includes a peripheral region overlapping the light blocking layer.

16. The display device of claim 15, wherein the color filters overlap at least a portion of the peripheral region, the first pixel region, and the second pixel region.

17. The display device of claim 15, wherein:

the display panel further comprises a pixel definition layer, wherein each of a plurality of first pixel openings expose the first light emitting element and the second light emitting element, and each of a plurality of second pixel openings spaced apart from the plurality of first pixel openings are defined in the pixel definition layer.

18. The display device of claim 17, wherein:

the display panel comprises a light emitting region at least partially overlapping the plurality of first pixel openings, a non-light emitting region at least partially overlapping the pixel definition layer, and a pixel definition layer opening region at least partially overlapping the second pixel openings, wherein the light blocking layer opening region further comprises a margin region at least partially overlapping the non-light emitting region, and wherein the transmission region at least partially overlaps the pixel definition layer opening region.

19. An electronic device, comprising:

a display device including a first active region comprising a light blocking layer opening region, a pixel region, and a peripheral region, and having optical signals transmitted therethrough, and a second active region including the pixel region and the peripheral region and adjacent to the first active region; and an electronic module at least partially overlapping the first active region and disposed below the display device, wherein the display device further includes:

a display panel in which a first light emitting element and a second light emitting element adjacent to the first light emitting element are disposed;

a sensor layer including a touch electrode disposed on the display panel; and an anti-reflection layer disposed on the sensor layer including color filters and a light blocking layer, wherein the pixel region includes a first pixel region having the first light emitting element disposed therein, and a second pixel region adjacent to the first pixel region in a first direction and having the second light emitting element disposed therein, wherein the light blocking layer opening region does not overlap with the color filters and the light blocking layer in a vertical projection, wherein the light blocking layer opening region is adjacent to the first pixel region in a second direction crossing the first direction, wherein the light blocking layer opening region comprises a transmission region, and the transmission region is spaced apart from the first pixel region, wherein the touch electrode includes a first portion having a first width and a second portion having a second width that is smaller than the first width, wherein the first portion is disposed between the first light emitting element and the second light emitting element, and the second portion is disposed between the transmission region and the second pixel region, and wherein the first light emitting element and the second light emitting element at least partially overlap the pixel region of the first active region, and the first portion, and the second portion at least partially overlap the peripheral region of the first active region.

20. The electronic device of claim 19, wherein the electronic module is an illuminance sensor.

* * * * *